(12) United States Patent
Masunishi et al.

(10) Patent No.: US 11,834,326 B2
(45) Date of Patent: Dec. 5, 2023

(54) SENSOR AND ELECTRONIC DEVICE

(71) Applicant: KABUSHIKI KAISHA TOSHIBA, Tokyo (JP)

(72) Inventors: Kei Masunishi, Kawasaki Kanagawa (JP); Yasushi Tomizawa, Fuchu Tokyo (JP); Etsuji Ogawa, Kawasaki Kanagawa (JP); Ryunosuke Gando, Yokohama Kanagawa (JP); Shiori Kaji, Kawasaki Kanagawa (JP); Hiroki Hiraga, Saitama Saitama (JP); Fumito Miyazaki, Yokohama Kanagawa (JP); Daiki Ono, Yokohama Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 151 days.

(21) Appl. No.: 17/461,835

(22) Filed: Aug. 30, 2021

(65) Prior Publication Data
US 2022/0259035 A1  Aug. 18, 2022

(30) Foreign Application Priority Data
Feb. 17, 2021  (JP) .................... 2021-023043

(51) Int. Cl.
*B81B 3/00* (2006.01)
(52) U.S. Cl.
CPC .... *B81B 3/0021* (2013.01); *B81B 2201/0235* (2013.01); *B81B 2201/0271* (2013.01);
(Continued)
(58) Field of Classification Search
CPC .................................................. B81B 3/0021
(Continued)

(56) References Cited

U.S. PATENT DOCUMENTS

2014/0260608 A1* 9/2014 Lin .................... G01C 19/5747
  73/504.12
2017/0328931 A1* 11/2017 Zhang .................. B81B 3/0051

FOREIGN PATENT DOCUMENTS

JP  H4-115165 A  4/1992
WO  WO-0029855 A1 * 5/2000 ......... G01C 19/5712

OTHER PUBLICATIONS

Dongsuk D. Shin, et al.; "Environmentally Roust Differential Resonant Accelerometer in a Wafer-Scale Encapsulation Process," IEEE Mems 2017, pp. 17-20 (2017).

* cited by examiner

*Primary Examiner* — Walter L Lindsay, Jr.
*Assistant Examiner* — Philip T Fadul
(74) *Attorney, Agent, or Firm* — Finnegan, Henderson, Farabow, Garrett & Dunner, LLP

(57) ABSTRACT

According to one embodiment, a sensor includes a first detection element. The first detection element includes a base body, a first support member fixed to the base body, a conductive first movable member, and a first conductive part fixed to the base body. The first movable member includes first, second, third, fourth and fifth movable parts. In a second direction crossing a first direction from the base body toward the first movable member, the third movable part is between the first and second movable parts. In the second direction, the fourth movable part is between the first and third movable parts. In the second direction, the fifth movable part is between the third and second movable parts. The first movable part is supported by the first support member. The second, third, fourth and fifth movable parts are separated from the base body.

20 Claims, 21 Drawing Sheets

(52) U.S. Cl.
CPC ... *B81B 2201/0278* (2013.01); *B81B 2203/04* (2013.01); *B81B 2203/06* (2013.01)

(58) Field of Classification Search
USPC ..................................................... 73/514.01
See application file for complete search history.

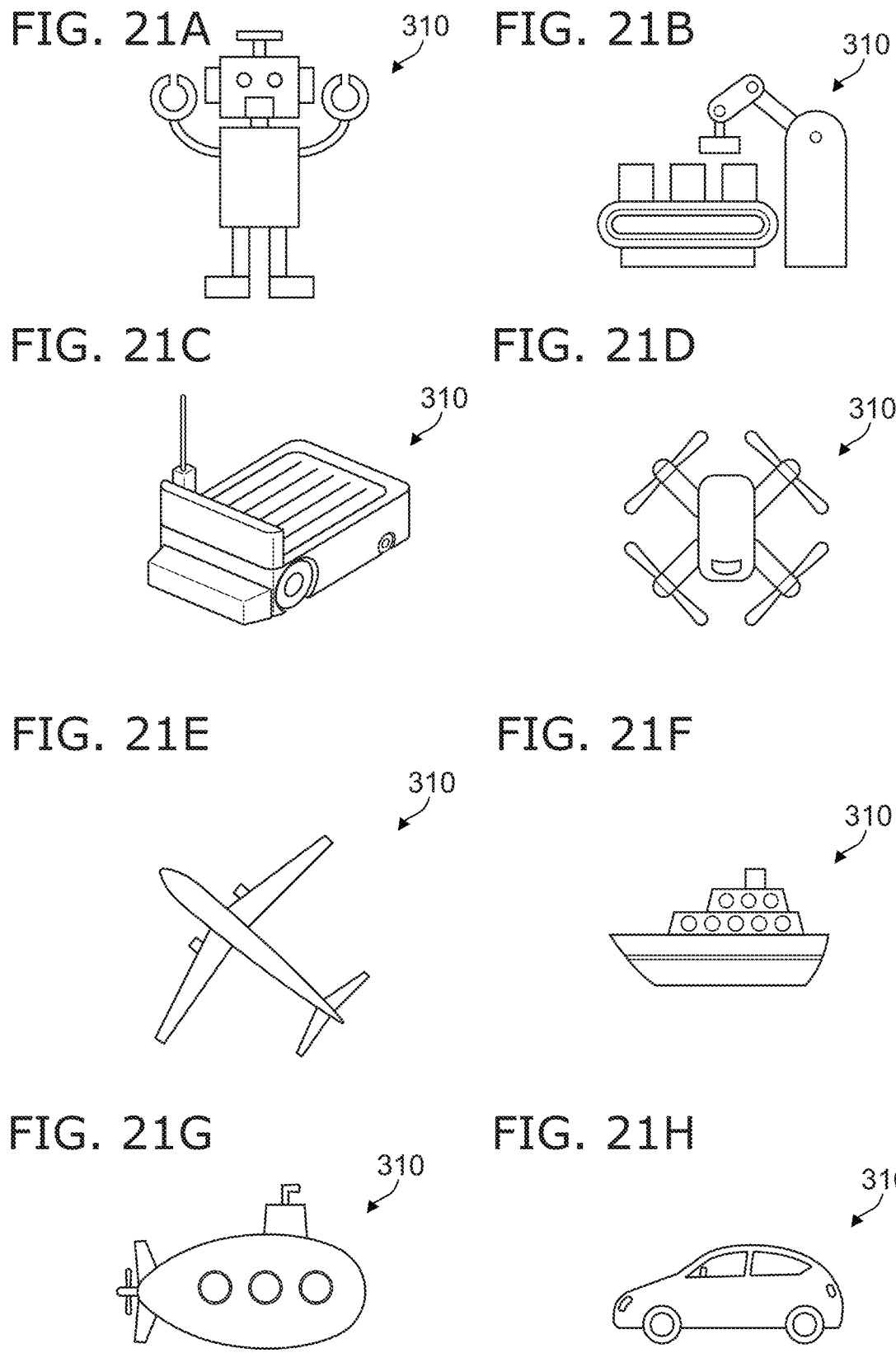

US 11,834,326 B2

SENSOR AND ELECTRONIC DEVICE

CROSS-REFERENCE TO RELATED APPLICATIONS

This application is based upon and claims the benefit of priority from Japanese Patent Application No. 2021-023043, filed on Feb. 17, 2021; the entire contents of which are incorporated herein by reference.

FIELD

Embodiments described herein relate generally to a sensor and an electronic device.

BACKGROUND

For example, there is a sensor that utilizes a MEMS structure. It is desirable to increase the detection accuracy of the sensor.

BRIEF DESCRIPTION OF THE DRAWINGS

FIGS. 21A to 21H are schematic views illustrating applications of the electronic devices.

DETAILED DESCRIPTION

Figure 1A:
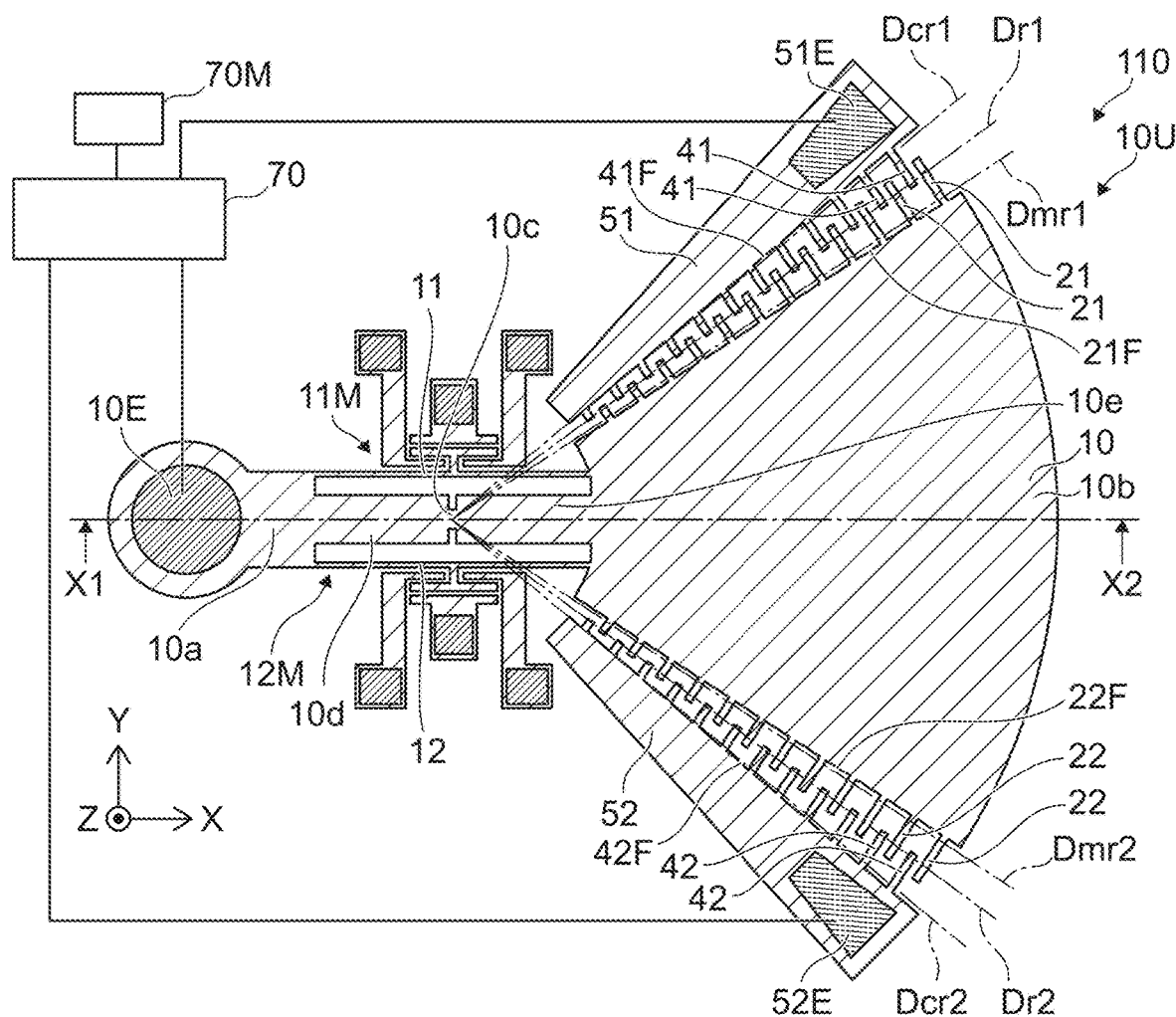
FIGS. 1A and 1B are schematic views illustrating a sensor according to a first embodiment.

According to one embodiment, a sensor includes a first detection element. The first detection element includes a base body, a first support member fixed to the base body, a conductive first movable member, and a first conductive part fixed to the base body. The first movable member includes a first movable part, a second movable part, a third movable part, a fourth movable part and a fifth movable part. In a second direction crossing a first direction from the base body toward the first movable member, the third movable part is between the first movable part and the second movable part. In the second direction, the fourth movable part is between the first movable part and the third movable part. In the second direction, the fifth movable part is between the third movable part and the second movable part. The first movable part is supported by the first support member. The second movable part, the third movable part, the fourth movable part and the fifth movable part are separated from the base body. A first width along a third direction of the first movable part is larger than a fourth width along the third direction of the fourth movable part and larger than a fifth width along the third direction of the fifth movable part. The third direction crosses a first plane including the first direction and the second direction. A third width of the third movable part is smaller than the fourth width and smaller than the fifth width. A third length along the second direction of the third movable part is shorter than a fourth length along the second direction of the fourth movable part and shorter than a fifth length along the second direction of the fifth movable part. The second movable part includes a first movable facing part facing the first conductive part in a second plane including the second direction and the third direction. The first movable facing part includes a first movable protrusion portion protruding toward the first conductive part. The first conductive part includes a first conductive facing part facing the first movable facing part. The first conductive facing part includes a first conductive protrusion portion protruding toward the first movable facing part. The first conductive protrusion portion overlaps the first movable protrusion portion in a first radiation direction passing through the third movable part and being along the second plane.

According to one embodiment, a sensor includes a first detection element. The first detection element includes a base body, a first support member fixed to the base body, a first movable member, and a first conductive part fixed to the base body. The first movable member includes a first movable part, a second movable part, a third movable part, a fourth movable part and a fifth movable part. In a second direction crossing a first direction from the base body toward the first movable member, the third movable part is between the first movable part and the second movable part. In the second direction, the fourth movable part is between the first movable part and the third movable part. In the second direction, the fifth movable part is between the third movable part and the second movable part. The first movable part is supported by the first support member. The second movable part, the third movable part, the fourth movable part and the fifth movable part are separated from the base body. A first width along a third direction of the first movable part is larger than a fourth width along the third direction of the fourth movable part and larger than a fifth width along the third direction of the fifth movable part. The third direction crosses a first plane including the first direction and the second direction. A third width of the third movable part is smaller than the fourth width and smaller than the fifth width. A third length along the second direction of the third movable part is shorter than a fourth length along the second direction of the fourth movable part and shorter than a fifth length along the second direction of the fifth movable part. The second movable part includes a first movable facing part facing the first conductive part in a second plane including the second direction and the third direction. The first conductive part includes a first conductive facing part facing the first movable facing part. The first movable facing part and the first conductive facing part extend along a first radiation direction passing through the third movable part and being along the second plane.

According to one embodiment, an electronic device includes the sensor described above and a circuit controller configured to control a circuit based on a signal obtained from the sensor.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1A, 1B, 2A, 2B, and FIG. 3 are schematic views illustrating a sensor according to the first embodiment.

Figure 1B:
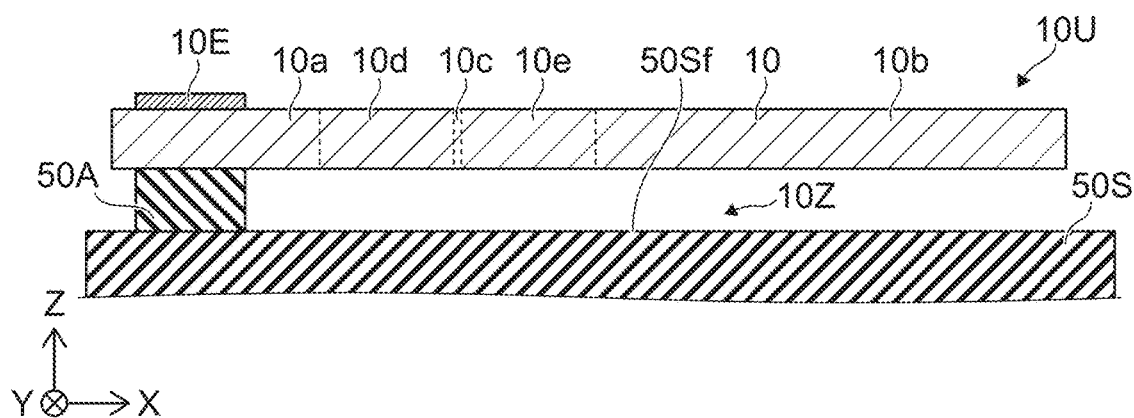
Figure 2A:
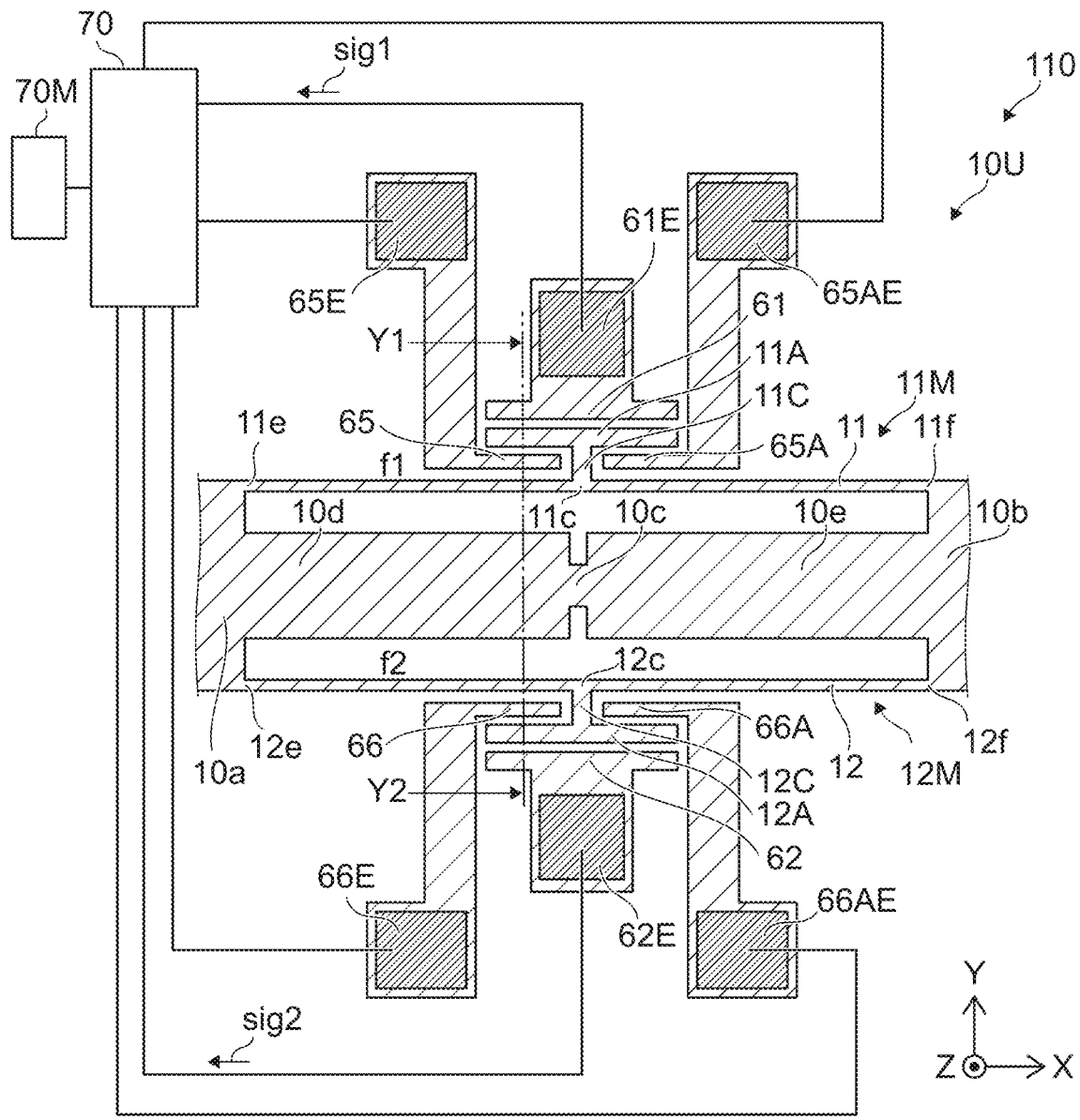
FIGS. 2A and 2B are schematic views illustrating the sensor according to the first embodiment.
Figure 2B:
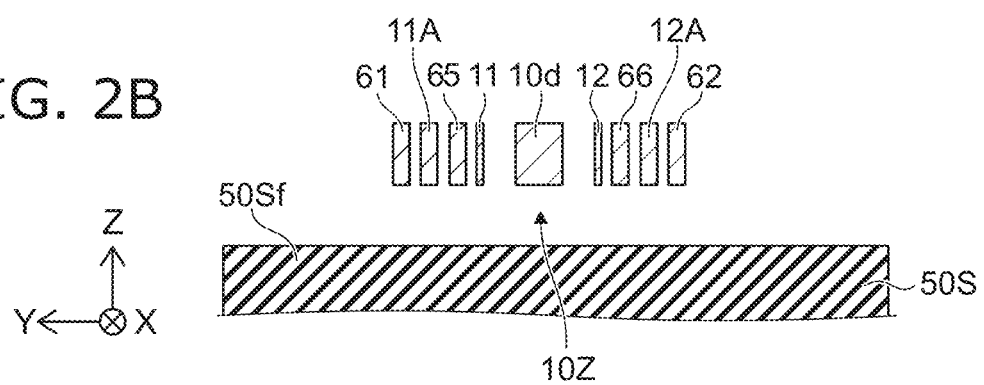
Figure 3:
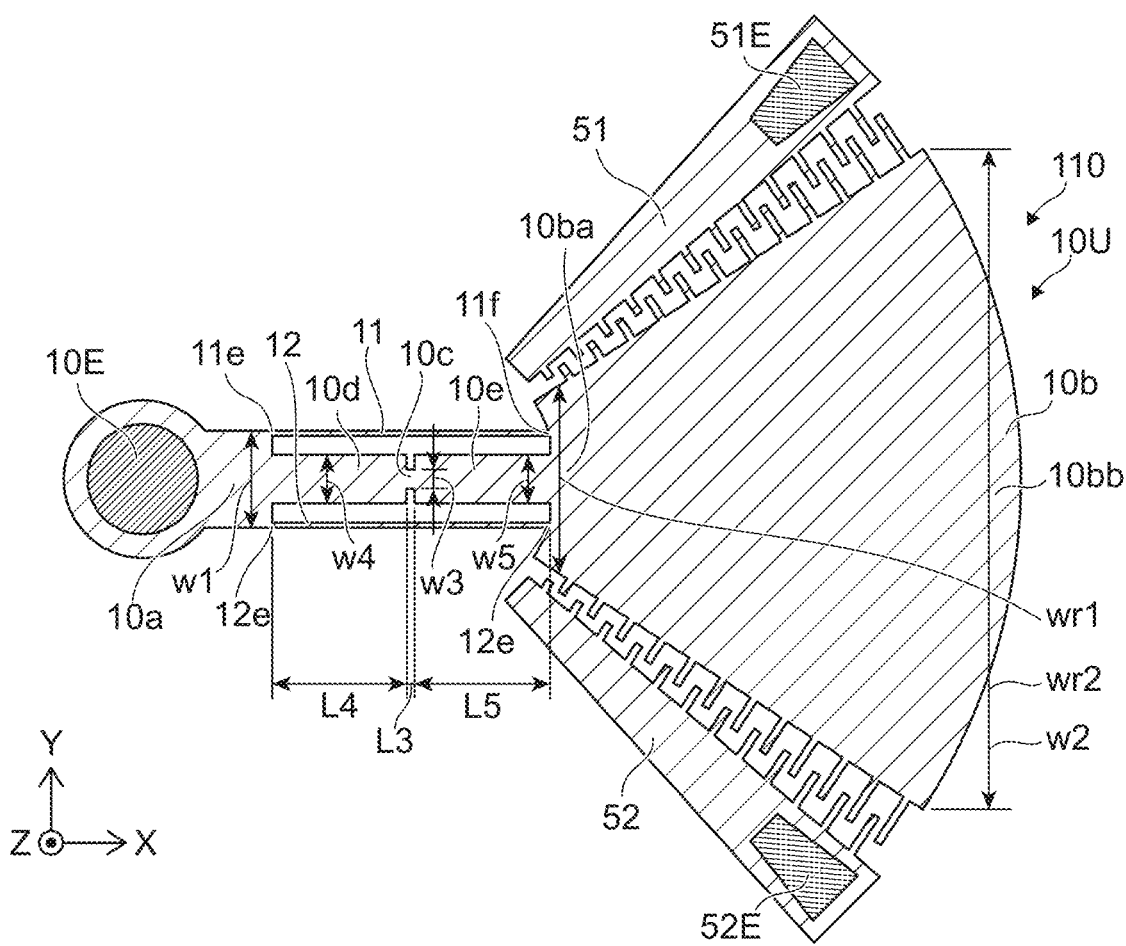
FIG. 3 is a schematic view illustrating the sensor according to the first embodiment.

FIG. 1A is a plan view. FIG. 1B is a cross-sectional view taken along line X1-X2 of FIG. 1A. FIG. 2A is an enlarged plan view of a portion of FIG. 1A. FIG. 2B is a sectional view taken along line Y1-Y2 of FIG. 2A. FIG. 3 is a plan view.

As shown in FIGS. 1A and 1B, the sensor 110 according to the embodiment includes a first detection element 10U. The first detection element 10U includes a base body 50S, a first support member 50A, a first movable member 10, and a first conductive part 51.

As shown in FIG. 1A, the controller 70 may be provided. For example, the sensor 110 may include a controller 70. The controller 70 may be provided separately from the sensor 110. The controller 70 is electrically connected to, for example, an electrode 10E electrically connected to the first movable member 10. The controller 70 may acquire information from a storage part 70M. The controller 70 may store information in the storage part 70M. The storage part 70M may be included in the sensor 110. The storage part 70M may be provided separately from the sensor 110.

The first support member 50A is fixed to the base body 50S. The first support member 50A may have, for example, an insulating property.

The first movable member 10 is conductive. The first movable member 10 may include, for example, a semiconductor including impurities (for example, silicon). A portion of the first movable member 10 is supported by the first support member 50A. The first movable member 10 is separated from the base body 50S. For example, the other part of the first movable member 10 is separated from the base body 50S. As shown in FIG. 1B, a gap 10Z is provided between the first surface 50Sf of the base body 50S and a portion of the first movable member 10. The first surface 50Sf is, for example, an upper surface.

The first direction from the base body 50S toward the first movable member 10 is taken as the Z-axis direction. One direction perpendicular to the Z-axis direction is taken as the X-axis direction. The direction perpendicular to the Z-axis direction and the X-axis direction is taken as the Y-axis direction. For example, the XY plane is along the first plane 50Sf.

The first movable member 10 includes a first movable part 10a, a second movable part 10b, a third movable part 10c, a fourth movable part 10d, and a fifth movable part 10e. In the second direction, there is the third movable part 10c between the first movable part 10a and the second movable part 10b. The second direction crosses the first direction (Z-axis direction) from the substrate 50S toward the first movable member 10. The second direction is, for example, the X-axis direction.

In the second direction (for example, the X-axis direction), there is the fourth movable part 10d between the first movable part 10a and the third movable part 10c. In the second direction, there is the fifth movable part 10e between the third movable part 10c and the second movable part 10b. For example, the first to fifth movable parts 10a to 10e are continuous with each other.

As shown in FIG. 1B, the first movable part 10a is supported by the first support member 50A. The second movable part 10b, the third movable part 10c, the fourth movable part 10d, and the fifth movable part 10e are separated from the base body 50S.

As shown in FIG. 3, a width of the first movable part 10a along the third direction is taken as a first width w1. The third direction crosses a first plane including the first direction (Z-axis direction) and the second direction (e.g., X-axis direction). The third direction is, for example, the Y-axis direction. A width of the second movable part 10b along the third direction is taken as a second width w2. A width of the third movable part 10c along the third direction is taken as a third width w3. A width of the fourth movable part 10d along the third direction is taken as a fourth width w4. A width of the fifth movable part 10e along the third direction is taken as a fifth width w5. If the width changes along the X-axis direction, the width may be a maximum value.

The first width w1 is larger than the fourth width w4 and larger than the fifth width w5. The third width w3 is smaller than the fourth width w4 and smaller than the fifth width w5. The second width w2 is larger than the fourth width w4 and larger than the fifth width w5.

A length of the third movable part 10c along the second direction (X-axis direction) is defined as the third length L3. The length of the fourth movable part 10d along the second direction is defined as the fourth length L4. The length of the fifth movable part 10e along the second direction is defined as the fifth length L5. The third length L3 is shorter than the fourth length L4 and shorter than the fifth length L5. The third movable part 10c is, for example, a pivot part or a hinge part.

For example, when the first detection element 10U receives acceleration (or force), the second movable part 10b is possible to be displaced in the XY plane along the rotation direction (arc direction) centered on the third movable part 10c. The second movable part 10b is, for example, "Proof Mass".

As shown in FIG. 3, the second movable part 10b includes a first partial region 10ba and a second partial region 10bb. The first partial region 10ba is between the fifth movable part 10e and the second partial region 10bb. A length wr1 along the third direction (for example, the Y-axis direction) of the first partial region 10ba is shorter than a length wr2 along the third direction of the second partial region 10bb. The planar shape of the second movable part 10b is, for example, a fan shape.

As shown in FIG. 2A, in this example, the first movable member 10 includes a first beam 11 and a second beam 12. The first beam 11 includes a first end portion 11e and a first other end portion 11f. The first end portion 11e is connected to the first movable part 10a. The first other end portion 11f is connected to the second movable part 10b. The second beam 12 includes a second end portion 12e and a second end portion 12f. The second end portion 12e is connected to the first movable part 10a. The second other end portion 12f is connected to the second movable part 10b. In the third direction (Y-axis direction), the third movable part 10c is between the first beam 11 and the second beam 12.

As described above, the second movable part 10b is displaced according to the acceleration received by the first detection element 10U. The difference between a first resonance frequency of the first beam 11 and a second resonance frequency of the second beam 12 can be changed according to the displacement of the second movable part 10b. For example, depending on the acceleration, one of the compressive stress and the tensile stress is applied to the first beam 11, and the other of the compressive stress and the tensile stress is applied to the second beam 12. This causes a change in the resonant frequency of these beams. In one example, the acceleration may be detected by detecting changes in these resonance frequencies.

As shown in FIG. 2A, the first beam 11 is included in the first movable beam 11M. The second beam 12 is included in the second movable beam 12M. For example, the first movable beam 11M includes a first movable conductive part 11A and a first movable connecting part 11C. The first beam 11 includes a first intermediate part 11c between the first end portion 11e and the first other end portion 11f. The first movable connecting part 11C connects the first intermediate part 11c and the first movable conductive part 11A to each other. For example, the second movable beam 12M includes a second movable conductive part 12A and a second movable connecting part 12C. The second beam 12 includes a second intermediate part 12c between the second end portion 12e and the second other end portion 12f. The second movable connecting part 12C connects the second intermediate part 12c and the second movable conductive part 12A to each other.

As shown in FIGS. 2A and 2B, in this example, a first fixed conductive part 61 and a second fixed conductive part 62 are provided. These fixed conductive parts may be fixed to the base body 50S, for example. The first fixed conductive part 61 faces the first movable conductive part 11A, for example, in the Y-axis direction. The second fixed conductive part 62 faces the second movable conductive part 12A, for example, in the Y-axis direction. For example, the displacement of the first movable beam 11M and the second movable beam 12M may be detected by the first fixed conductive part 61 and the second fixed conductive part 62. The first fixed conductive part 61 and the second fixed conductive part 62 may function as, for example, detection electrodes.

As shown in FIGS. 2A and 2B, in this example, a fifth conductive part 65, a sixth conductive part 66, a conductive part 65A, and a conductive part 66A are provided. These conductive parts may be fixed to the base body 50S. The fifth conductive part 65 and the conductive part 65A face, for example, the first movable conductive part 11A in the Y-axis direction. The fifth conductive part 65 and the conductive part 65A may face the first beam 11 in the Y-axis direction, for example. The sixth conductive part 66 and the conductive part 66A face the second movable conductive part 12A, for example, in the Y-axis direction. The fifth conductive part 66 and the conductive part 66A may face the second beam 12 in the Y-axis direction, for example. For example, the first movable beam 11M is possible to vibrate due to the voltage applied to the fifth conductive part 65 and the conductive part 65A. For example, the second movable beam 12M is possible to vibrate due to the voltage applied to the sixth conductive part 66 and the conductive part 66A. The fifth conductive part 65, the conductive part 65A, the sixth conductive part 66, and the conductive part 66A may function as, for example, at least one of a driving electrode and an adjusting electrode.

As shown in FIG. 2A, the controller 70 is electrically connected to the first fixed conductive part 61, the second fixed conductive part 62, the fifth conductive part 65, the conductive part 65A, the sixth conductive part 66 and the conductive part 66A. The electrical connection is made, for example, via the electrodes 61E, 62E, 65E, 65AE, 66E and 66AE.

As shown in FIG. 2A, a length of the first movable conductive part 11A along the X-axis direction is longer than a length of the first movable connecting part 11C along the X-axis direction. A length of the second movable conductive part 12A along the X-axis direction is longer than a length of the second movable connecting part 12C along the X-axis direction. With such a configuration, the width of the region where the movable conductive part and the fixed conductive part face each other is increased. Higher accuracy detection is possible.

The first conductive part 51 shown in FIG. 1A is fixed to the base body 50S. As shown in FIG. 1A, the first conductive part 51 faces the second movable part 10b in the XY plane. For example, the second movable part 10b includes a first movable facing part 21F. The first movable facing part 21F faces the first conductive part 51 in the second plane (X-Y plane) including the second direction and the third direction. The first movable facing part 21F includes a first movable protrusion portion 21 projecting toward the first conductive part 51.

As shown in FIG. 1A, the first conductive part 51 includes a first conductive facing part 41F. The first conductive facing part 41F faces the first movable facing part 21F in the XY plane. The first conductive facing part 41F includes a first conductive protrusion portion 41 projecting toward the first movable facing part 21F.

The first conductive protrusion portion 41 overlaps the first movable protrusion portion 21 in a first radial direction Dr1. The first radial direction Dr1 is a direction that passes through the third movable part 10c and is along the second plane (X-Y plane).

As shown in FIG. 1A, for example, the first movable facing part 21F includes multiple first movable protrusion portions 21. The region between the multiple first movable protrusion portions 21 is a recess portion. The first movable facing part 21F includes multiple irregularities. The first conductive facing part 41F includes multiple first conductive protrusion portions 41. The region between the multiple first conductive protrusion portions 41 is a recess portion. The first conductive facing part 41F includes multiple irregularities.

One of the multiple first conductive protrusion portions 41 is between one of the multiple first movable protrusion portions 21 and another one of the multiple first movable protrusion portions 21 in the first radial direction Dr1. One of the multiple first movable protrusion portions 21 is between one of the multiple first conductive protrusion portions 41 and another one of the multiple first conductive protrusion portions 41 in the first radial direction Dr1. A comb-shaped electrode pair is formed by the multiple first movable protrusion portions 21 and the multiple first conductive protrusion portions 41. For example, the second movable part 10b can be controlled more effectively by the comb-shaped electrode pair.

As shown in FIG. 1A, the comb-shaped electrode pairs are arranged along the first radial direction Dr1 passing through the third movable part 10c. For example, it is easy for the second movable part 10b to rotate about the third movable part 10c. For example, when a voltage is applied between the first conductive part 51 and the second movable part 10b, the second movable part 10b can be stably displaced along the rotation direction (arc direction) around the third movable part 10c. The rotation (displacement) of the second movable part 10b with acceleration can be obtained more stably. For example, a sensor which can improve detection accuracy can be provided.

As shown in FIG. 1A, the controller 70 is electrically connected to the first conductive part 51. In this example, the controller 70 is electrically connected to the first conductive part 51 via the electrode 51E. On the other hand, the controller 70 is electrically connected to the first movable member 10 via, for example, the electrode 10E. The controller 70 is configured to apply a voltage between the first conductive part 51 and the second movable part 10b. The controller 70 can displace the second movable part 10b with respect to the first conductive part 51 by the voltage. For example, the controller 70 is configured to control the voltage applied between the first conductive part 51 and the second movable part 10b so as to control the difference between the resonance frequencies of the two beams. As a result, the acceleration can be detected with high accuracy. An example of detection will be described later.

As shown in FIG. 1A, the multiple first movable protrusion portions 21 are arranged along a first movable radiation direction Dmr1. The first movable radiation direction Dmr1 passes through the third movable part 10c and is along the second plane (X-Y plane). The multiple first conductive protrusion portions 41 are arranged along a first conductive radiation direction Dcr1. The first conductive radiation direction Dcr1 passes through the third movable part 10c and is along the second plane (X-Y plane). The first movable radiation direction Dmr1 may be substantially parallel to the first conductive radiation direction Dcr1. The first movable radiation direction Dmr1 and the first conductive radiation direction Dcr1 may be substantially parallel to the first radiation direction Dr1.

As shown in FIG. 1A, the first detection element 10U may further include a second conductive part 52. The second conductive part 52 is fixed to the base body 50S. The second movable part 10b includes a second movable facing part 22F. The second movable facing part 22F faces the second conductive part 52 in the second plane (X-Y plane). The second movable facing part 22F includes a second movable protrusion portion 22 projecting toward the front two conductive parts 52.

As shown in FIG. 1A, the second conductive part 52 includes a second conductive facing part 42F. The second conductive facing part 42F faces the second movable facing part 22F. The second conductive facing part 42F includes a second conductive protrusion portion 42 projecting toward the second movable facing part 22F. The second conductive protrusion portion 42 overlaps the second movable protrusion portion 22 in a second radial direction Dr2. The second radial direction Dr2 passes through the third movable part 10c and is along the second plane (X-Y plane).

As shown in FIG. 1A, for example, the second movable facing part 22F includes multiple second movable protrusion portions 22. The area between the multiple second movable protrusion portions 22 is a recess portion. The second movable facing part 22F includes a multiple irregularities. The second conductive facing part 42F includes a multiple second conductive protrusion portions 42. The region between the multiple second conductive protrusion portions 42 is a recess portion. The second conductive facing portion 42F includes multiple irregularities.

One of the multiple second conductive protrusion portions 42 is between one of the multiple second movable protrusion portions 22 and another one of the multiple second movable protrusion portions 22 in the second radial direction Dr2. One of the multiple second movable protrusion portions 22 is between one of the multiple second conductive protrusion portions 42 and another one of the multiple second conductive protrusion portions 42 in the second radial direction Dr2. A comb-shaped electrode pair is formed by the multiple second movable protrusion portions 22 and the multiple first conductive protrusion portions 42. For example, the second movable part 10b can be controlled more effectively by the comb-shaped electrode pair.

The comb-shaped electrode pairs are arranged along the second radial direction Dr2 passing through the third movable part 10c. For example, it is easy for the second movable part 10b to rotate about the third movable part 10c. For example, when a voltage is applied between the second conductive part 52 and the second movable part 10b, the second movable part 10b can be stably displaced along the rotation direction (arc direction) around the third movable part 10c. The rotation (displacement) of the second movable part 10b with acceleration can be obtained more stably. For example, a sensor which can improve detection accuracy can be provided.

For example, the second radial direction Dr2 crosses the first radial direction Dr1. As shown in FIG. 1A, the controller 70 is electrically connected to the second conductive part 52 via the electrode 52E. For example, as will be described later, by switching between the voltage applied to the first conductive part 51 and the voltage applied to the second conductive part 52, the second movable part 10b becomes easy to be displaced along a desired direction.

As shown in FIG. 1A, the multiple second movable protrusion portions 22 are arranged along the second movable radiation direction Dmr2. The second movable radiation direction Dmr2 passes through the third movable part 10c and is along the second plane (X-Y plane). The multiple second conductive protrusion portions 42 are arranged along a second conductive radiation direction Dcr2. The second conductive radiation direction Dcr2 passes through the third movable part 10c and is along the second plane (X-Y plane). The second movable radiation direction Dmr2 may be substantially parallel to the second conductive radiation direction Dcr2. The second movable radiation direction Dmr2 and the second conductive radiation direction Dcr2 may be substantially parallel to the second radiation direction Dr2.

Figure 4:
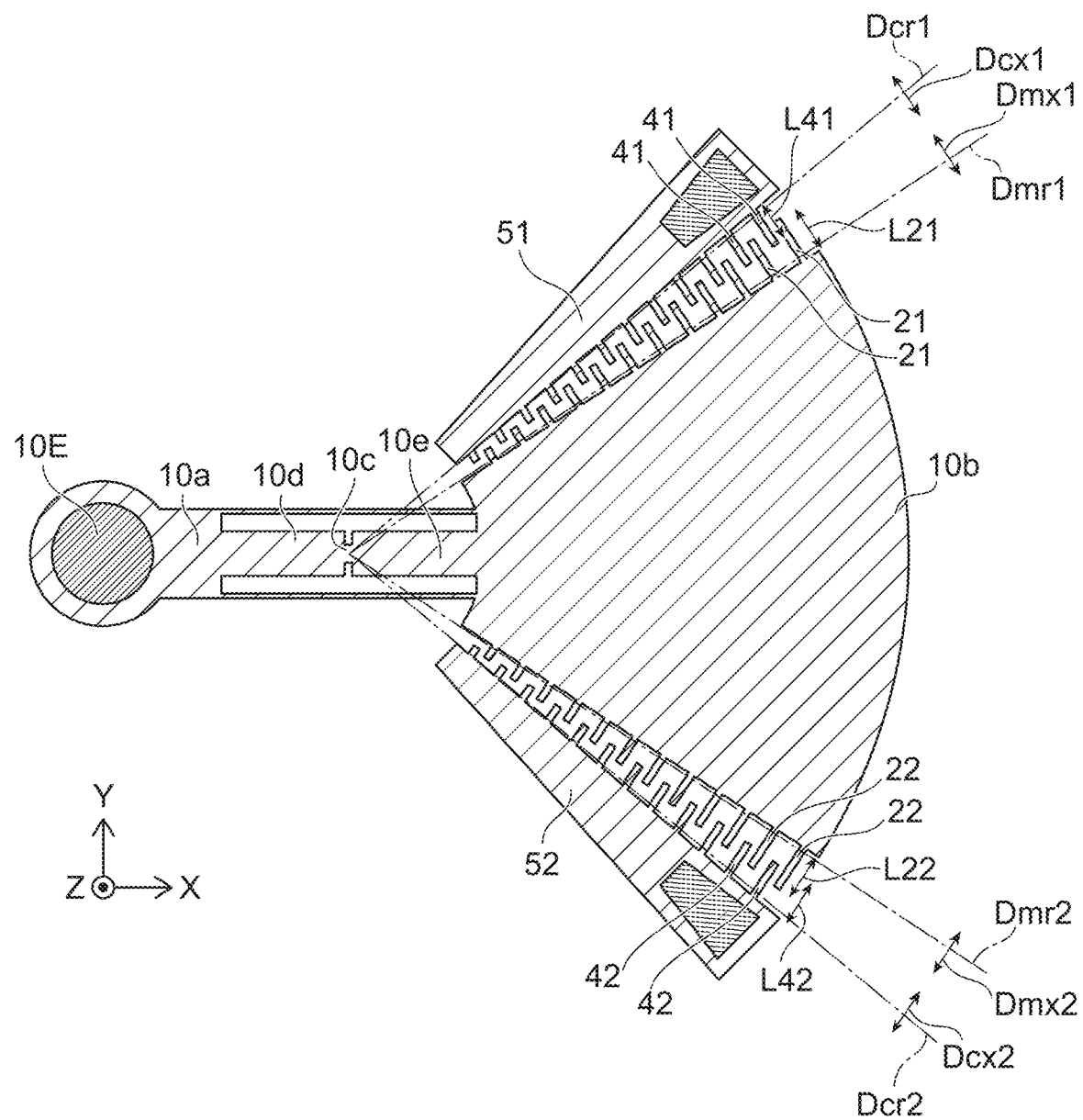
FIG. 4 is a schematic plan view illustrating the sensor according to the first embodiment.

FIG. 4 is a schematic plan view illustrating the sensor according to the first embodiment.

As shown in FIG. 4, a length of the multiple first movable protrusion portions 21 in the protruding direction may change depending on the distance from the third movable portion 10c of the multiple first movable protrusion portions 21. For example, a direction that is along the second plane (X-Y plane) and crosses the first movable radiation direction Dmr1 is taken as a first movable arc direction Dmx1. The length of the multiple first movable protrusion portions 21 along the first movable arc direction Dmx1 becomes longer as the distance from the third movable portion 10c increases. For example, the distance between one of the multiple first movable protrusion portions 21 and the third movable portion 10c is longer than the distance between another one of the multiple first movable protrusion portions 21 and the third movable portion 10c. The length of the multiple first movable protrusion portions 21 along the one first movable arc direction Dmx1 is longer than the length of the multiple first movable protrusion portions 21 along the other one first movable arc direction Dmx1. The length in the protruding direction may be a length along an arc.

As shown in FIG. 4, a direction that is along the second plane (X-Y plane) and crosses the first conductive radiation direction Dcr1 is taken as a first conductive arc direction Dcx1. The distance between one of the multiple first conductive protrusion portions 41 and the third movable part 10c is longer than the distance between another one of the multiple first conductive protrusion portions 41 and the third movable part 10c. The length of the multiple first conductive protrusion portions 41 along the above-mentioned one first conductive arc direction Dcx1 is longer than the length of the multiple first conductive protrusion portions 41 along the other one above-mentioned first conductive arc direction Dcx1. The distance may be a length along the arc.

The second movable part 10b can be controlled more effectively by the multiple first movable protrusion portions 21 and the multiple first conductive protrusion portions 41.

For example, a length of the multiple first movable protrusion portions 21 along the first movable arc direction Dmx1 increases in proportion to the distance of the multiple first movable protrusion portions 21 from the third movable part 10b. For example, a length of the multiple first conductive protrusion portions 41 along the first conductive arc direction Dcx1 increases in proportion to the distance of the multiple first conductive protrusion portions 41 from the third movable part 10c. The second movable part 10b can be controlled more effectively. The length of the protrusion portion may be a length along the arc.

As shown in FIG. 4, for example, a direction that is along the second plane (X-Y plane) and crosses the second movable radiation direction Dmr2 is taken as a second movable arc direction Dmx2. For example, the distance between one of the multiple second movable protrusion portions 22 and the third movable part 10c is longer than the distance between another one of the multiple second movable protrusion portions 22 and the third movable part 10c. The length of the multiple second movable protrusion portions 22 along the one second movable arc direction Dmx2 is longer than the length of the multiple second movable protrusion portions 22 along the other one second movable arc direction Dmx2. The distance may be a length along the arc.

As shown in FIG. 4, a direction that is along the second plane (X-Y plane) and crosses the second conductive radiation direction Dcr2 is taken as a second conductive arc direction Dcx2. The distance between one of the multiple second conductive protrusion portions 42 and the third movable part 10c is longer than the distance between another one of the multiple second conductive protrusion portions 42 and the third movable part 10c. The length of the multiple second conductive protrusion portions 42 along the one second conductive arc direction Dcx2 is longer than the length of the multiple second conductive protrusion portions 42 along the other one second conductive arc direction Dcx2.

As shown in FIG. 4, at least a portion of the second movable part 10b is between the first conductive part 51 and the second conductive part 52.

Figure 5A:
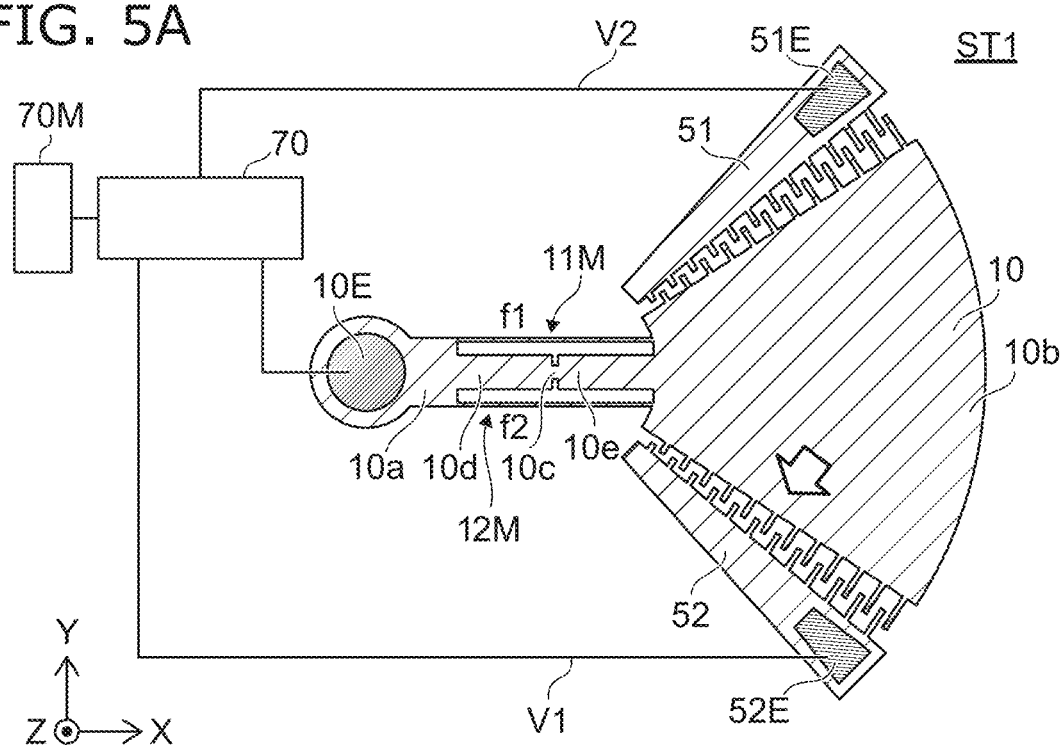
FIGS. 5A and 5B are schematic plan views illustrating operations of the sensor according to the first embodiment.
Figure 5B:
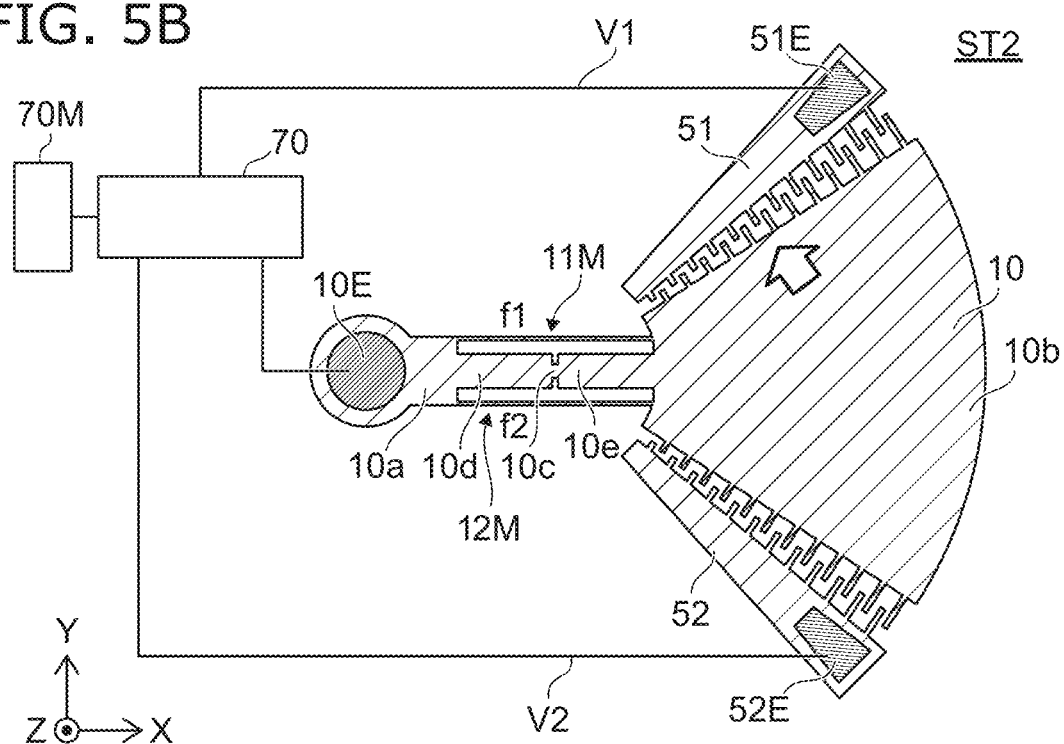

FIGS. 5A and 5B are schematic plan views illustrating the operations of the sensor according to the first embodiment.

As shown in FIG. 5A, for example, in the first voltage application operation ST1, the controller 70 applies a first voltage V1 between the first movable member 10 and the second conductive part 52. In the first voltage application operation ST1, the controller 70 applies a second voltage V2 between the first movable member 10 and the first conductive part 51. The absolute value of the second voltage V2 is smaller than the absolute value of the first voltage V1. The second voltage V2 may be, for example, a ground voltage. By the first voltage application operation ST1 like this, the second movable part 10b is rotated clockwise, for example.

As shown in FIG. 5B, for example, in the second voltage application operation ST2, the controller 70 applies the first voltage V1 between the first movable member 10 and the first conductive part 51. In the second voltage application operation ST2, the controller 70 applies the second voltage V2 between the first movable member 10 and the second conductive part 51. By the second voltage application operation ST2 like this, the second movable part 10b is rotated counterclockwise, for example.

The value of the first voltage V1 may be set to a value equal to or higher than the voltage that cancels the displacement of the second movable part 10b due to the acceleration received by the first detection element 10U, for example.

In the following, some examples of the sensor according to the embodiment will be described. In the following figures, in order to make the figure easier to see, a portion of the first movable beam 11M, a portion of the second movable beam 12M, the first fixed conductive part 61, the second fixed conductive part 62, the fifth conductive part 65, the conductive part 65A, the sixth conductive part 66, the conductive part 66A, the electrode 61E, the electrode 62E, the electrode 65E, the electrode 65AE, the electrode 66E, the electrode 66AE, and the like are omitted.

Figure 6:
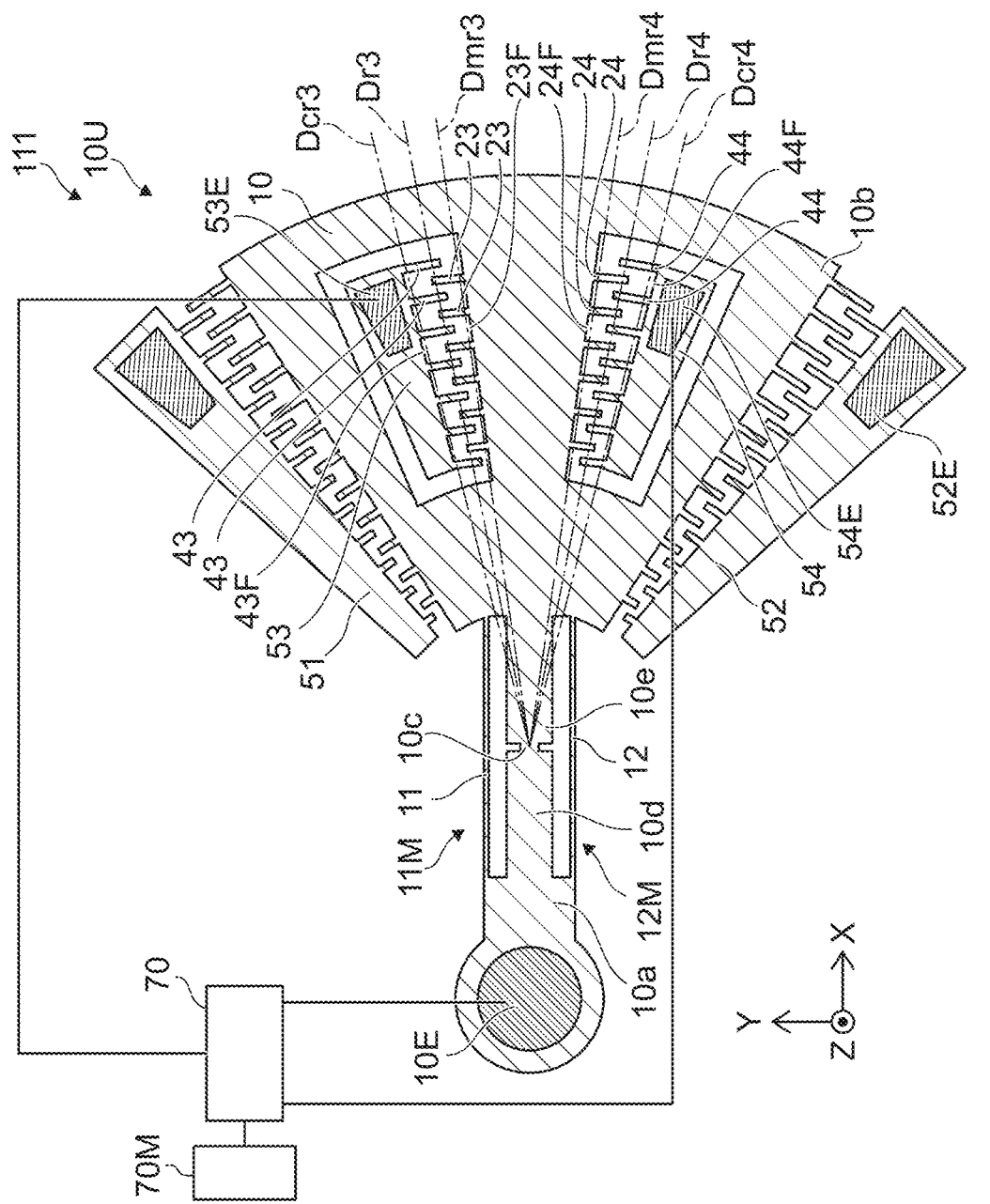
FIG. 6 is a schematic plan view illustrating a sensor according to the first embodiment.
Figure 7:
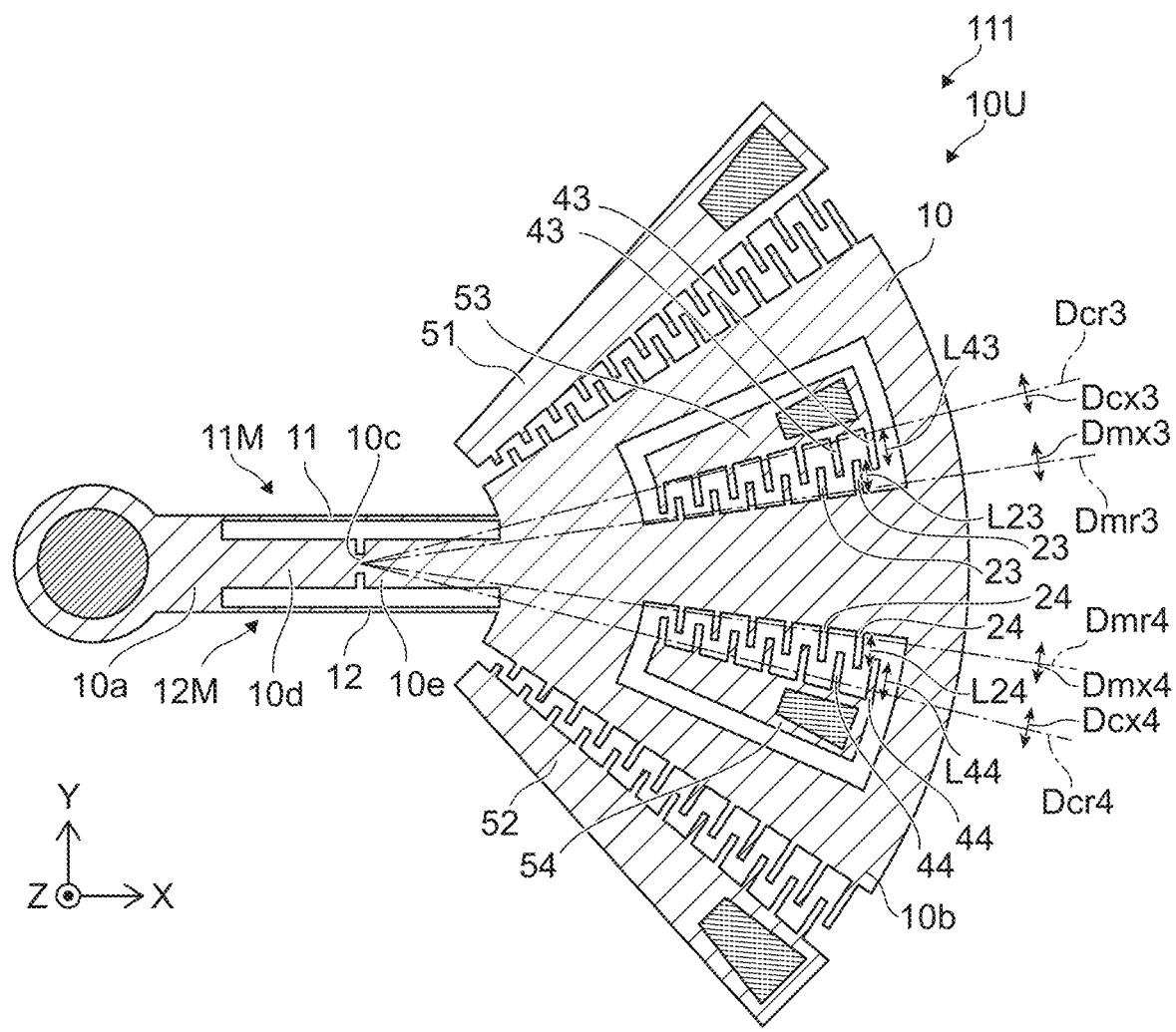
FIG. 7 is a schematic plan view illustrating the sensor according to the first embodiment.

FIGS. 6 and 7 are schematic plan views illustrating a sensor according to the first embodiment.

As shown in FIG. 6, in a sensor 111 according to the embodiment, the first detection element 10U further includes a third conductive part 53 in addition to the first conductive part 51 and the second conductive part 52. The third conductive part 53 is fixed to the base body 50S. The second movable part 10b includes a third movable facing part 23F. The third movable facing part 23F faces the third conductive part 53 in the second plane (X-Y plane). The third movable facing part 23F includes a third movable protrusion portion 23 projecting toward the third conductive part 53.

The third conductive part 53 includes a third conductive facing part 43F. The third conductive facing part 43F faces the third movable facing part 23F. The third conductive facing part 43F includes a third conductive protrusion portion 43 projecting toward the third movable facing part 23F. The third conductive protrusion portion 43 overlaps the third movable protrusion portion 23 in a third radial direction Dr3. The third radial direction Dr3 passes through the third movable part 10c and is along the second plane (X-Y plane).

A portion of the second movable part 10b is between the first conductive part 51 and the third conductive part 53 in the rotation direction (arc direction) centered on the third movable part 10c.

In this example, the first detection element 10U further includes a fourth conductive part 54. The fourth conductive part 54 is fixed to the base body 50S. The second movable part 10b includes a fourth movable facing part 24F. The fourth movable facing part 24F faces the fourth conductive part 54 in the second plane (X-Y plane). The fourth movable facing part 24F includes a fourth movable protrusion portion 24 projecting toward the fourth conductive part 54.

The fourth conductive part 54 includes a fourth conductive facing part 44F. The fourth conductive facing part 44F faces the fourth movable facing part 24F. The fourth conductive facing part 44F includes a fourth conductive protrusion portion 44 projecting toward the fourth movable facing part 24F.

The fourth conductive protrusion portion 44 overlaps the fourth movable protrusion portion 24 in a fourth radial direction Dr4. The fourth radial direction Dr4 passes through the third movable part 10c and is along the second plane (X-Y plane). A portion of the second movable part 10b is between the second conductive part 52 and the fourth conductive part 54 in the rotation direction (arc direction) centered on the third movable part 10c. For example, the third radial direction Dr3 is between the first radial direction Dr1 and the second radial direction Dr2. The fourth radial direction Dr4 is between the third radial direction Dr3 and the second radial direction Dr2.

As shown in FIG. 6, for example, the multiple third movable protrusion portions 23 are arranged along a third movable radiation direction Dmr3. The third movable radiation direction Dmr3 passes through the third movable part 10c and is along the second plane (X-Y plane). The multiple third conductive protrusion portions 43 are arranged along a third conductive radiation direction Dcr3. The third conductive radiation direction Dcr3 passes through the third movable part 10c and is along the second plane (X-Y plane). The third movable radiation direction Dmr3 may be substantially parallel to the third conductive radiation direction Dcr3. The third movable radiation direction Dmr3 and the third conductive radiation direction Dcr3 may be substantially parallel to the third radiation direction Dr3.

As shown in FIG. 6, for example, the multiple fourth movable protrusion portions 24 are arranged along a fourth movable radiation direction Dmr4. The fourth movable radiation direction Dmr4 passes through the third movable part 10c and is along the second plane (X-Y plane). The multiple fourth conductive protrusion portions 44 are arranged along a fourth conductive radiation direction Dcr4. The fourth conductive radiation direction Dcr4 passes through the third movable part 10c and is along the second plane (X-Y plane). The fourth movable radiation direction Dmr4 may be substantially parallel to the fourth conductive radiation direction Dcr4. The fourth movable radiation direction Dmr4 and the fourth conductive radiation direction Dcr4 may be substantially parallel to the fourth radiation direction Dr4. For example, the fourth radial direction Dr4 crosses the third radial direction Dr3.

As shown in FIG. 7, for example, a direction that crosses the third movable radiation direction Dmr3 along the second plane (X-Y plane) is taken as a third movable arc direction Dmx3. For example, the distance between one of the multiple third movable protrusion portions 23 and the third movable part 10c is longer than the distance between another one of the multiple third movable protrusion portions 23 and the third movable part 10c. The length of the multiple third movable protrusion portions 23 along the one third movable arc direction Dmx3 is longer than the length of the multiple third movable protrusion portions 23 along the other one third movable arc direction Dmx3. The distance may be a length along the arc.

As shown in FIG. 7, for example, a direction that crosses the third conductive radiation direction Dcr3 along the second plane (X-Y plane) is taken as a third conductive arc direction Dcx3. For example, the distance between one of the multiple third conductive protrusion portions 43 and the third movable part 10c is longer than the distance between another one of the multiple third conductive protrusion portions 43 and the third movable part 10c. The length of the multiple third conductive protrusion portions 43 along the above-mentioned one third conductive arc direction Dcx3 is longer than the length of the multiple third conductive protrusion portions 43 along the other one above-mentioned third conductive arc direction Dcx3. The distance may be a length along the arc.

As shown in FIG. 7, for example, a direction that crosses the fourth movable radiation direction Dmr4 along the second plane (X-Y plane) is taken as a fourth movable arc direction Dmx4. For example, the distance between one of the multiple fourth movable protrusion portions 24 and the third movable part 10c is longer than the distance between another one of the multiple fourth movable protrusion portions 24 and the third movable part 10c. The length of the multiple fourth movable protrusion portions 24 along the one fourth movable arc direction Dmx4 is longer than the length of the multiple fourth movable protrusion portions 24 along the other one fourth movable arc direction Dmx4. The distance may be a length along the arc.

As shown in FIG. 7, for example, a direction that crosses the fourth conductive radiation direction Dcr4 along the second plane (X-Y plane) is taken as a fourth conductive arc direction Dcx4. For example, the distance between one of the multiple fourth conductive protrusion portions 44 and the third movable part 10c is longer than the distance between another one of the multiple fourth conductive protrusion portions 44 and the third movable part 10c. The length of the multiple fourth conductive protrusion portions 44 along the above-mentioned one fourth conductive arc direction Dcx4 is larger than the length of the multiple fourth conductive protrusion portions 44 along the above-mentioned one other fourth conductive arc direction Dcx4. The distance may be a length along the arc.

As shown in FIG. 7, at least a portion of the third conductive part 53 is between the first conductive part 51 and the second conductive part 52. At least a portion of the fourth conductive part 54 is between the third conductive part 53 and the second conductive part 52.

As shown in FIG. 6, in the sensor 111, the third conductive part 53 is between the third movable facing part 23F and the first conductive part 51. The fourth conductive part 54 is between the fourth movable facing part 24F and the fourth conductive part 54.

Figure 8A:
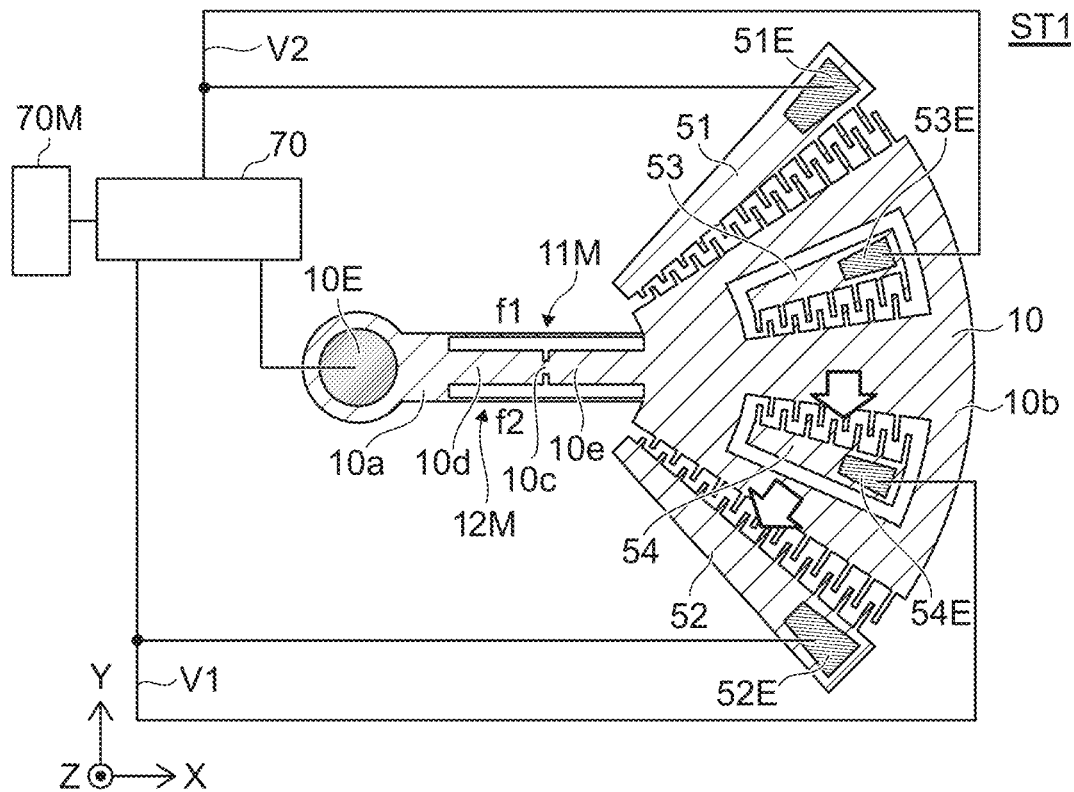
FIGS. 8A and 8B are schematic plan views illustrating operations of the sensor according to the first embodiment.
Figure 8B:
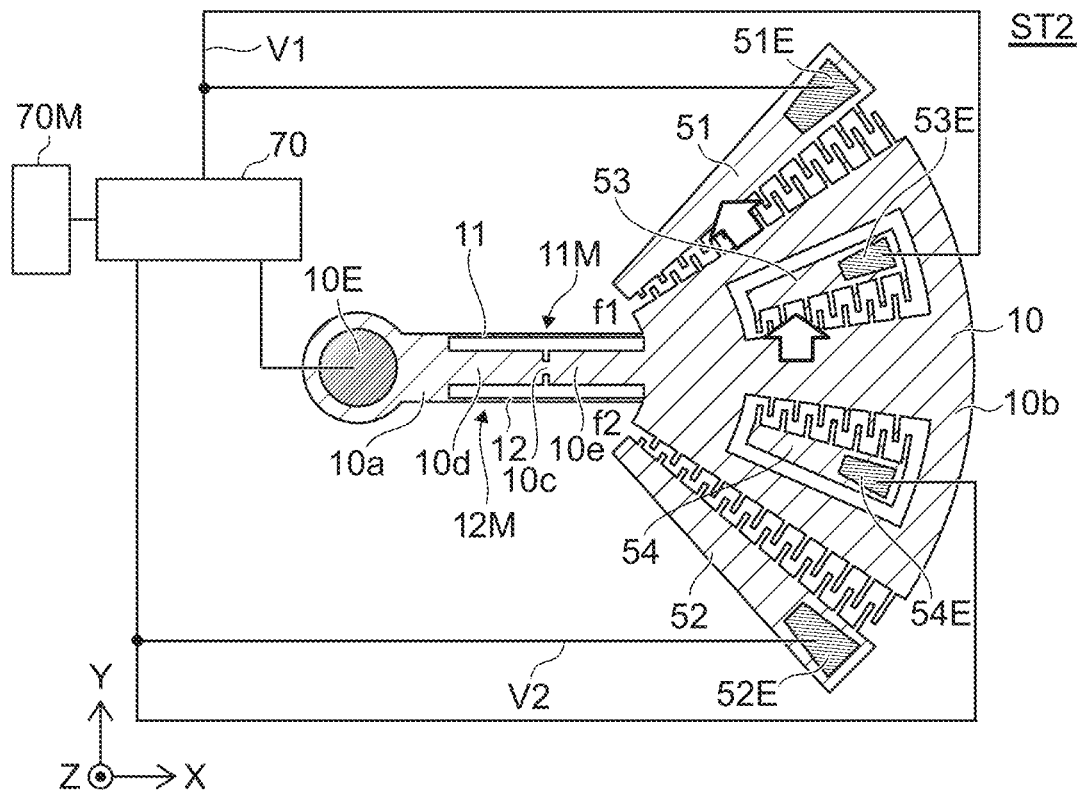

FIGS. 8A and 8B are schematic plan views illustrating operations of the sensor according to the first embodiment.

As shown in FIG. 8A, in the sensor 111, the third conductive part 53 is electrically connected to the first conductive part 51. The fourth conductive part 54 is electrically connected to the second conductive part 52. The controller 70 is electrically connected to the third conductive part 53 via, for example, the electrode 53E. For example, the controller 70 is electrically connected to the fourth conductive part 54 via the electrode 54E.

As shown in FIG. 8A, for example, in the first voltage application operation ST1, the controller 70 applies the first voltage V1 between the first movable member 10 and the second conductive part 52, and between the first movable member 10 and the fourth conductive part 54. In the first voltage application operation ST1, the controller 70 applies the second voltage V2 between the first movable member 10 and the first conductive part 51 and between the first movable member 10 and the third conductive part 53. By such the first voltage application operation ST1 like this, the second movable part 10b is rotated clockwise, for example.

As shown in FIG. 8B, for example, in the second voltage application operation ST2, the controller 70 applies the first voltage V1 between the first movable member 10 and the first conductive part 51, and between the first movable member 10 and the third conductive part 53. In the second voltage application operation ST2, the controller 70 applies the second voltage V2 between the first movable member 10 and the second conductive part 52 and between the first movable member 10 and the fourth conductive part 54. By such the second voltage application operation ST2 like this, the second movable part 10b is rotated counterclockwise, for example.

Figure 9:
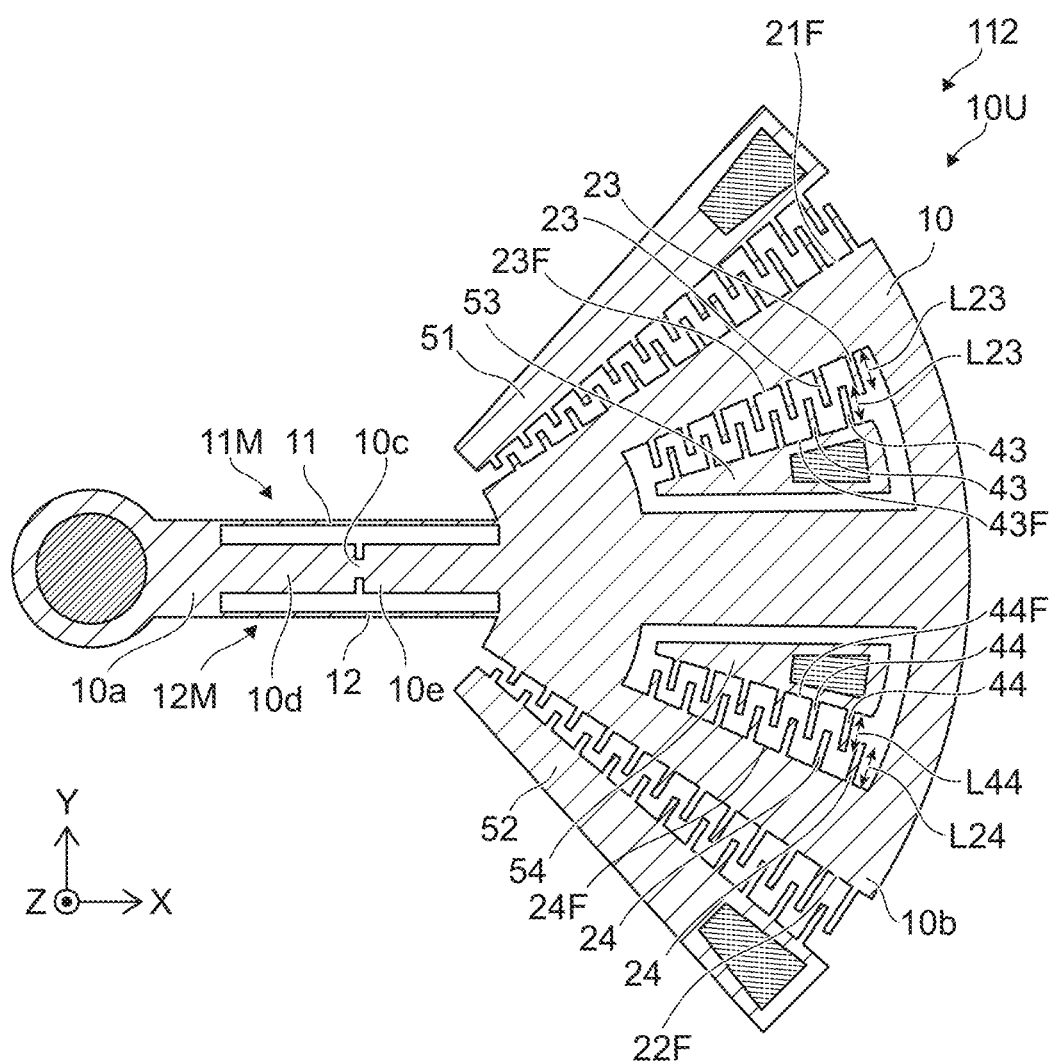
FIG. 9 is a schematic plan view illustrating a sensor according to the first embodiment.

FIG. 9 is a schematic plan view illustrating a sensor according to the first embodiment.

As shown in FIG. 9, in a sensor 112 according to the embodiment, the first detection element 10U includes the first conductive part 51, the second conductive part 52, the third conductive part 53, and the fourth conductive part 54. The first movable member 10 includes the first movable facing part 21F, the second movable facing part 22F, the third movable facing part 23F, and the fourth movable facing part 24F. In the sensor 112, the third movable facing part 23F is between the first conductive part 51 and the third conductive part 53. The fourth movable facing part 24F is between the second conductive part 52 and the fourth conductive part 54. The configuration of the sensor 112 other than this may be the same as the configuration of the sensor 111.

Figure 10A:
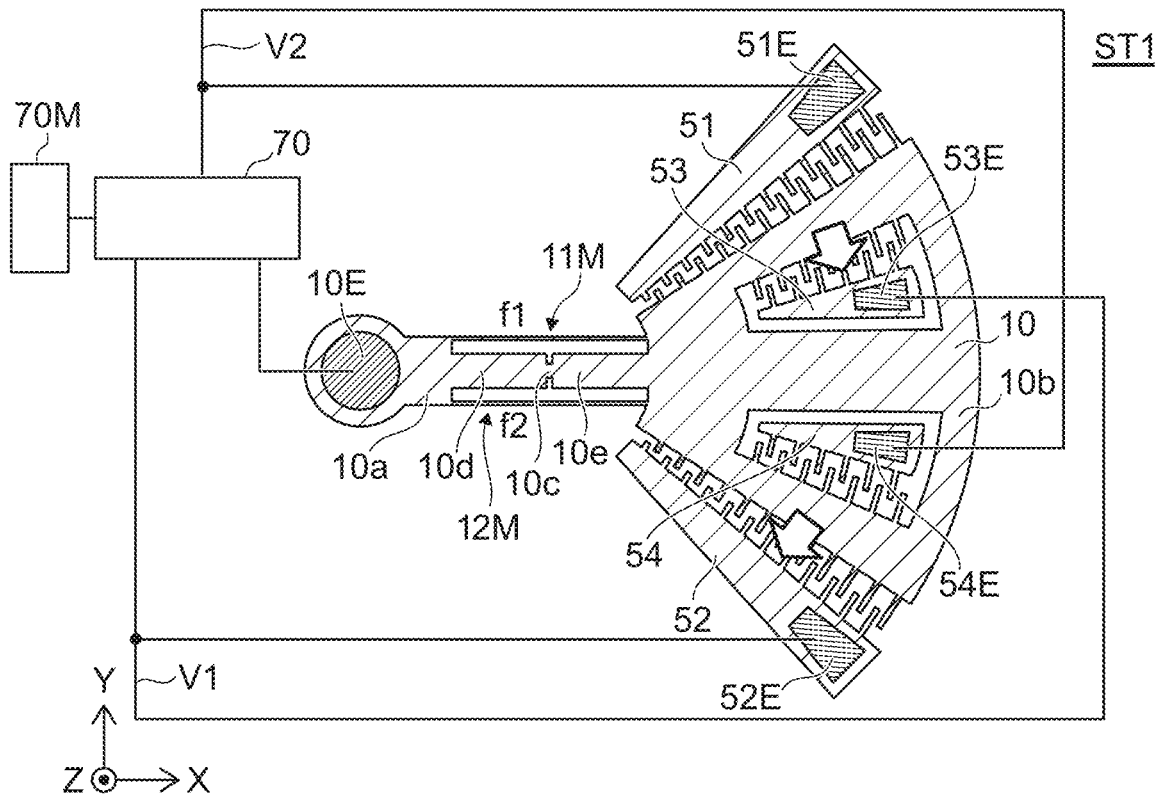
FIGS. 10A and 10B are schematic plan views illustrating operations of the sensor according to the first embodiment.
Figure 10B:
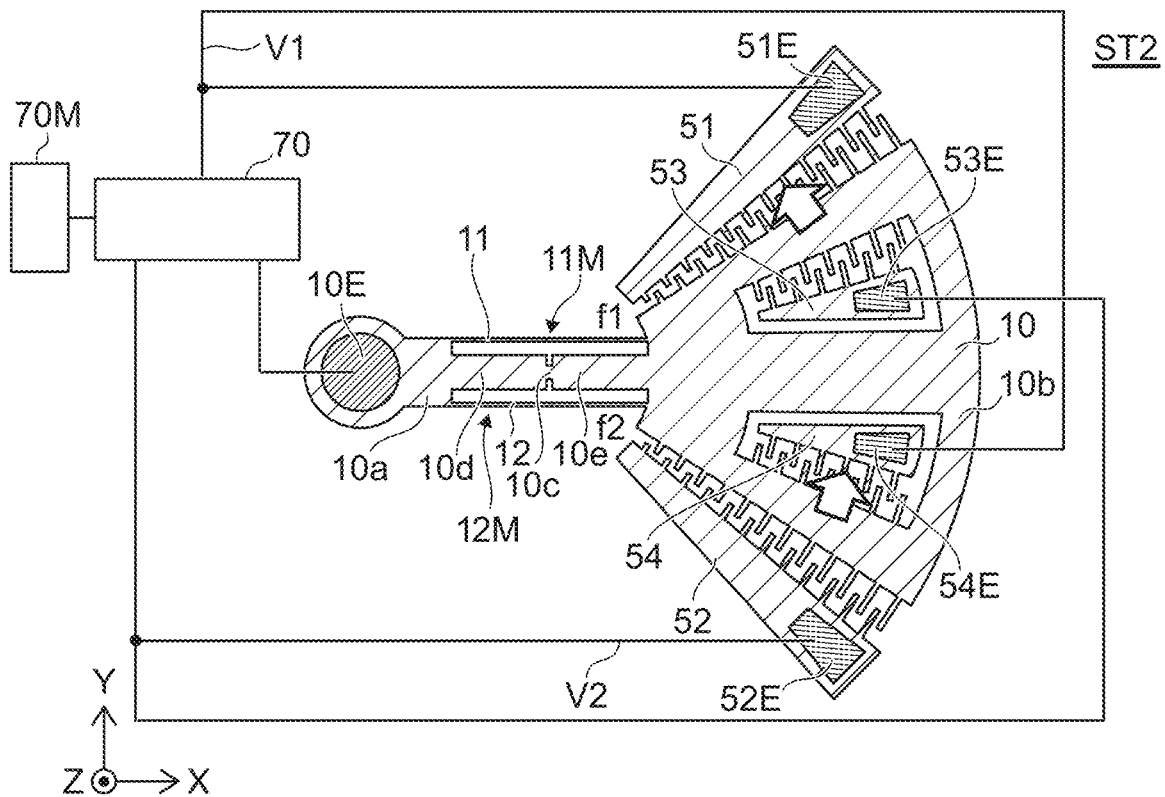

FIGS. 10A and 10B are schematic plan views illustrating operations of the sensor according to the first embodiment.

As shown in FIG. 10A, in the sensor 112, the third conductive part 53 is electrically connected to the second conductive part 52. The fourth conductive part 54 is electrically connected to the first conductive part 51.

As shown in FIG. 10A, for example, in the first voltage application operation ST1, the controller 70 applies the first voltage V1 between the first movable member 10 and the second conductive part 52, and between the first movable member 10 and the third conductive part 53. In the first voltage application operation ST1, the controller 70 applies the second voltage V2 between the first movable member 10 and the first conductive part 51 and between the first movable member 10 and the fourth conductive part 54. By such the first voltage application operation ST1 like this, the second movable part 10b is rotated clockwise, for example.

As shown in FIG. 10B, for example, in the second voltage application operation ST2, the controller 70 applies the second voltage V2 between the first movable member 10 and the first conductive part 51, and between the first movable member 10 and the fourth conductive part 54. In the second voltage application operation ST2, the controller 70 applies the second voltage V2 between the first movable member 10 and the second conductive part 52 and between the first movable member 10 and the third conductive part 53. By such the second voltage application operation ST2 like this, the second movable part 10b is rotated counterclockwise, for example.

Like the sensor 111 and the sensor 112, there is a second movable part 10b around at least a portion of the third conductive part 53 in the second plane (X-Y plane). There is a second movable part 10b around at least a portion of the fourth conductive part 54.

Figure 11:
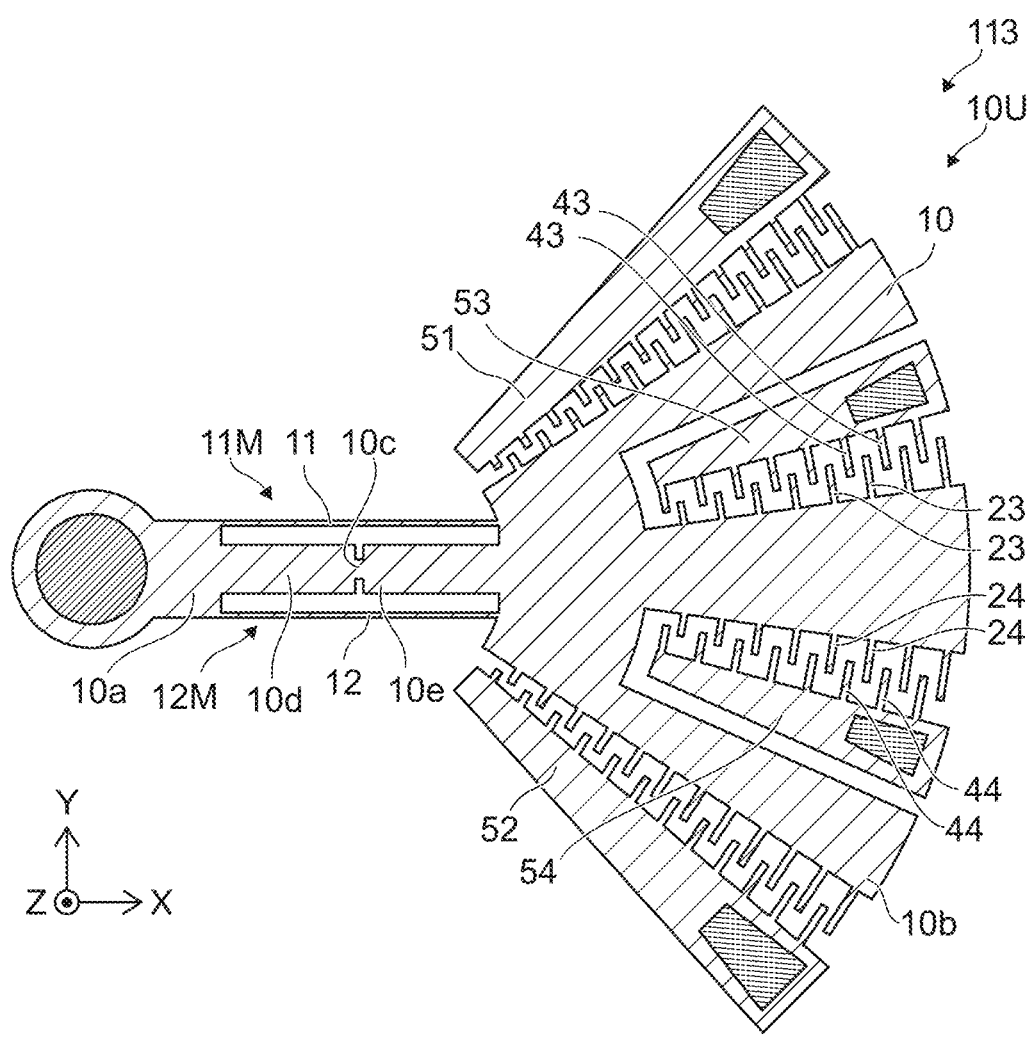
FIG. 11 is a schematic plan view illustrating a sensor according to the first embodiment.

FIG. 11 is a schematic plan view illustrating a sensor according to the first embodiment.

As shown in FIG. 11, also in a sensor 113 according to the embodiment, the first detection element 10U includes the first conductive part 51, the second conductive part 52, the third conductive part 53, and the fourth conductive part 54. A portion of the third conductive part 53 does not have to be surrounded by the second movable part 10b. A portion of the fourth conductive part 54 does not have to be surrounded by the second movable part 10b. The configuration of the sensor 113 other than this may be the same as the configuration of the sensor 111.

Figure 12:
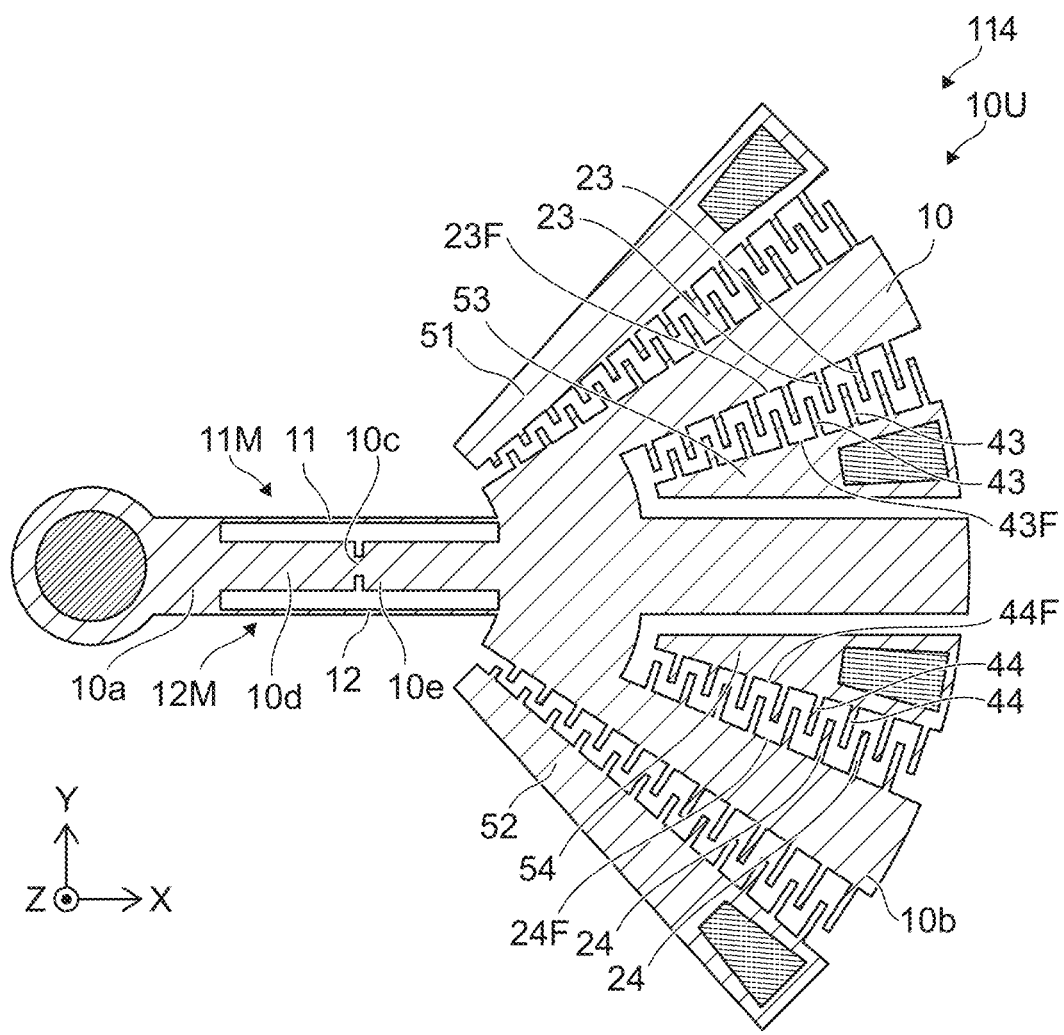
FIG. 12 is a schematic plan view illustrating a sensor according to the first embodiment.

FIG. 12 is a schematic plan view illustrating a sensor according to the first embodiment.

As shown in FIG. 12, also in a sensor 114 according to the embodiment, the first detection element 10U includes the first conductive part 51, the second conductive part 52, the third conductive part 53, and the fourth conductive part 54. A portion of the third conductive part 53 does not have to be surrounded by the second movable part 10b. A portion of the fourth conductive part 54 does not have to be surrounded by the second movable part 10b. The configuration of the sensor 114 other than this may be the same as the configuration of the sensor 112. The detection accuracy can also be improved in the sensors 111 to 114.

Figure 13:
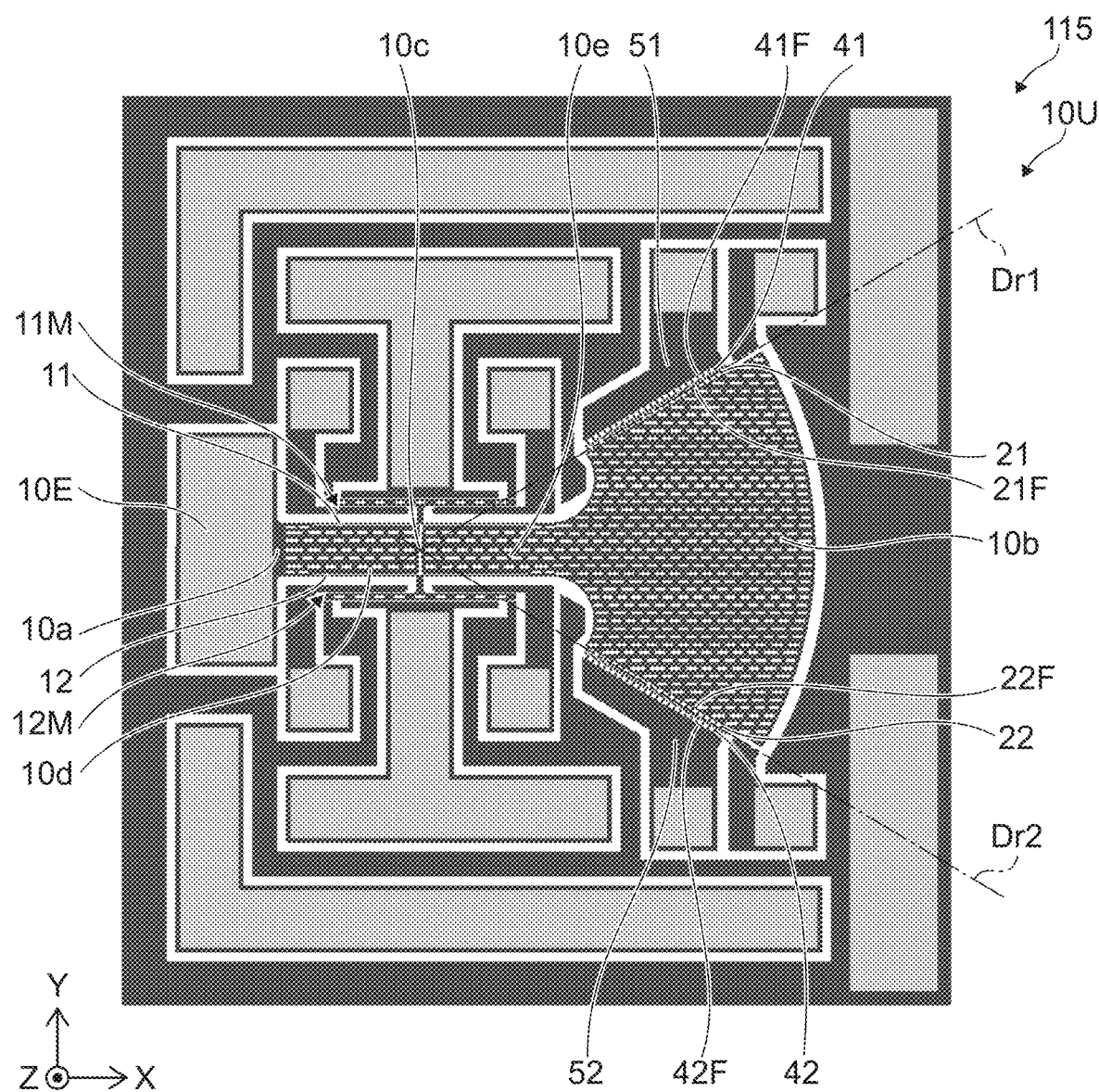
FIG. 13 is a schematic plan view illustrating a sensor according to the first embodiment.
Figure 14:
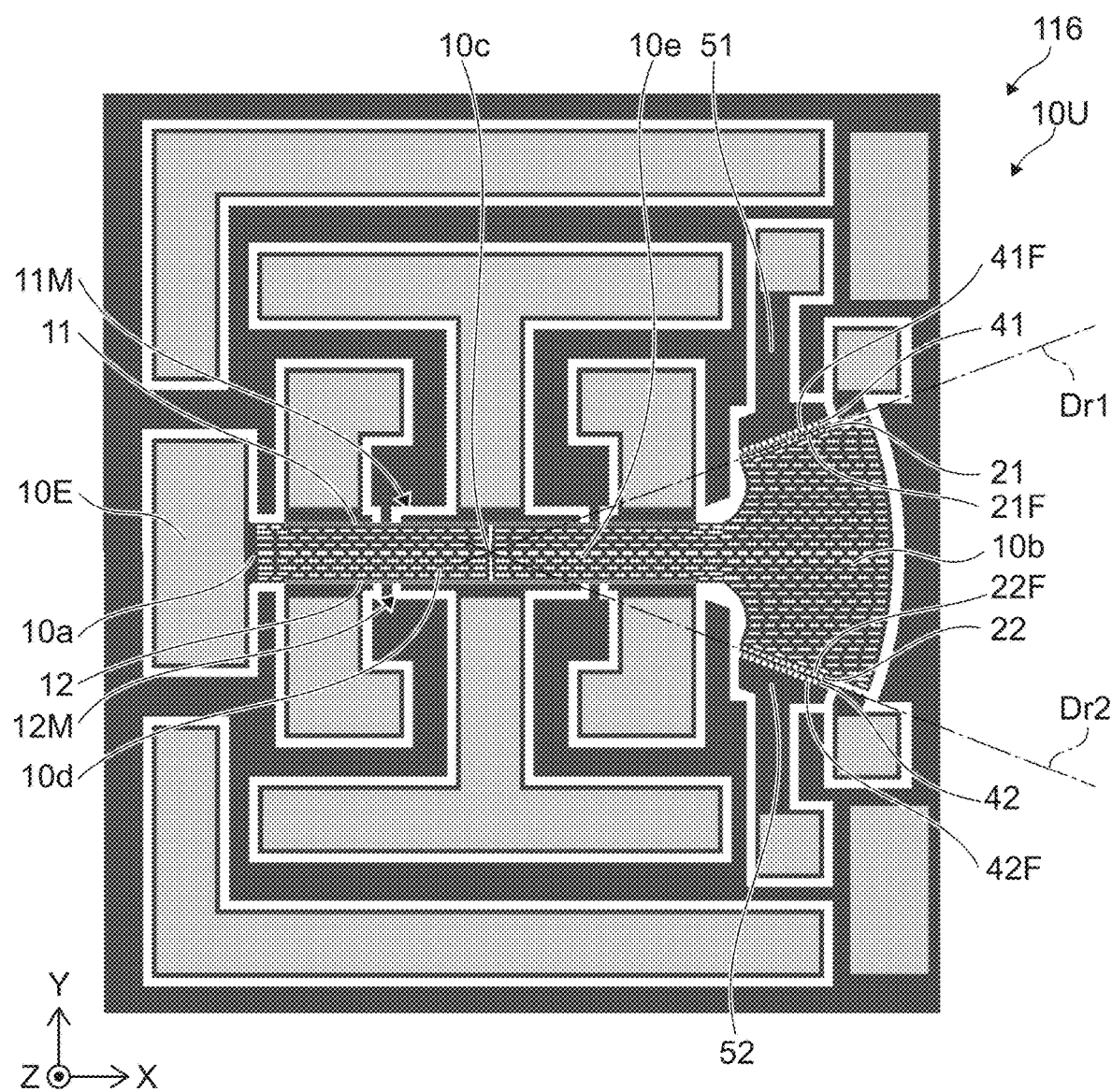
FIG. 14 is a schematic plan view illustrating a sensor according to the first embodiment.

FIGS. 13 and 14 are schematic plan views illustrating sensors according to the first embodiment.

As shown in FIGS. 13 and 14, also in a sensor 115 and a sensor 116 according to the embodiment, the first movable facing part 21F includes the first movable protrusion portion 21, and the first conductive facing part 41F includes the first conductive protrusion portion 41. The second movable facing part 22F includes the second movable protrusion portion 22, and the second conductive facing part 42F includes the second conductive protrusion portion 42. The detection accuracy can also be improved in the sensor 115 and the sensor 116.

Figure 15:
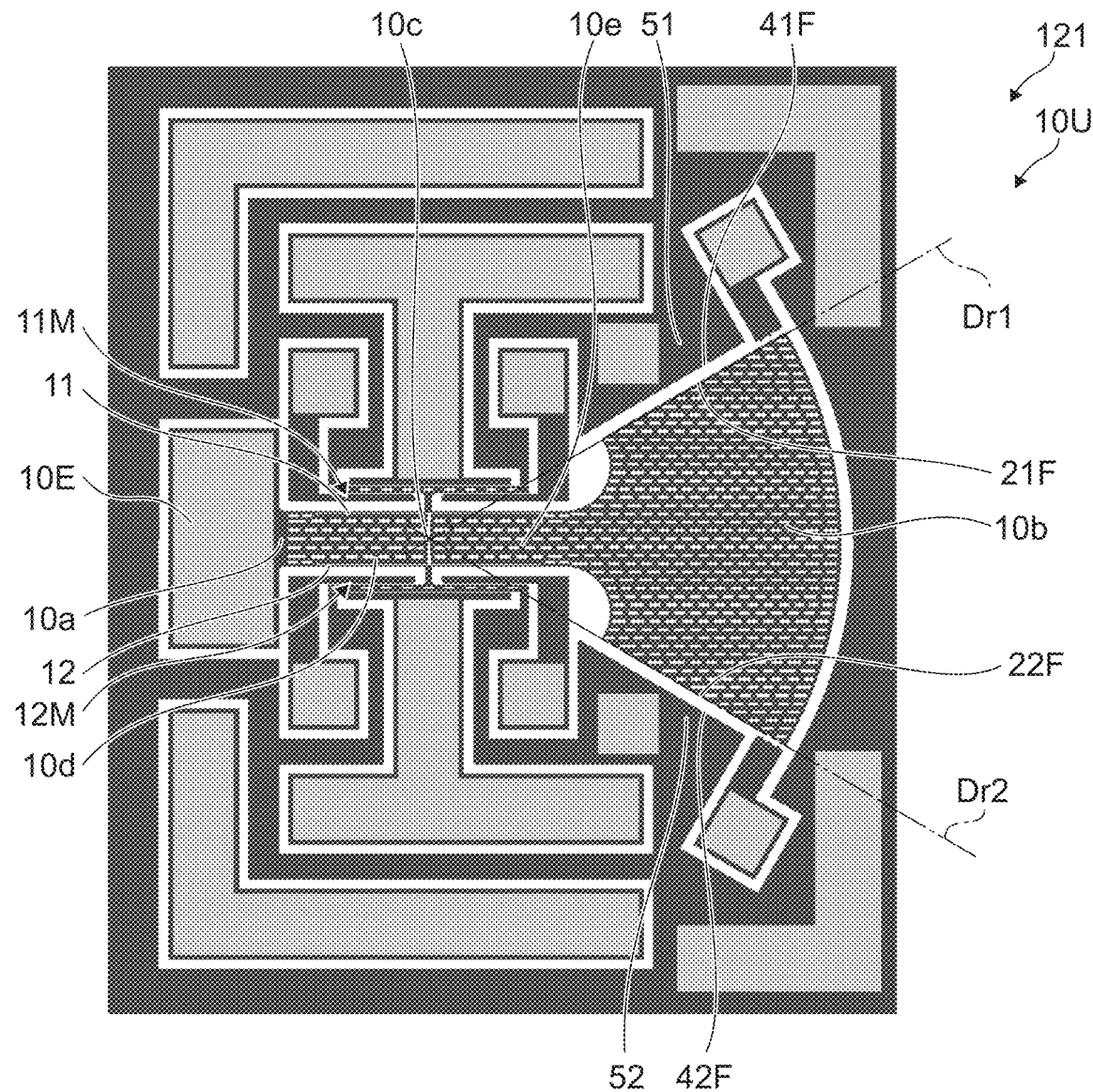
FIG. 15 is a schematic plan view illustrating a sensor according to the first embodiment.
Figure 16:
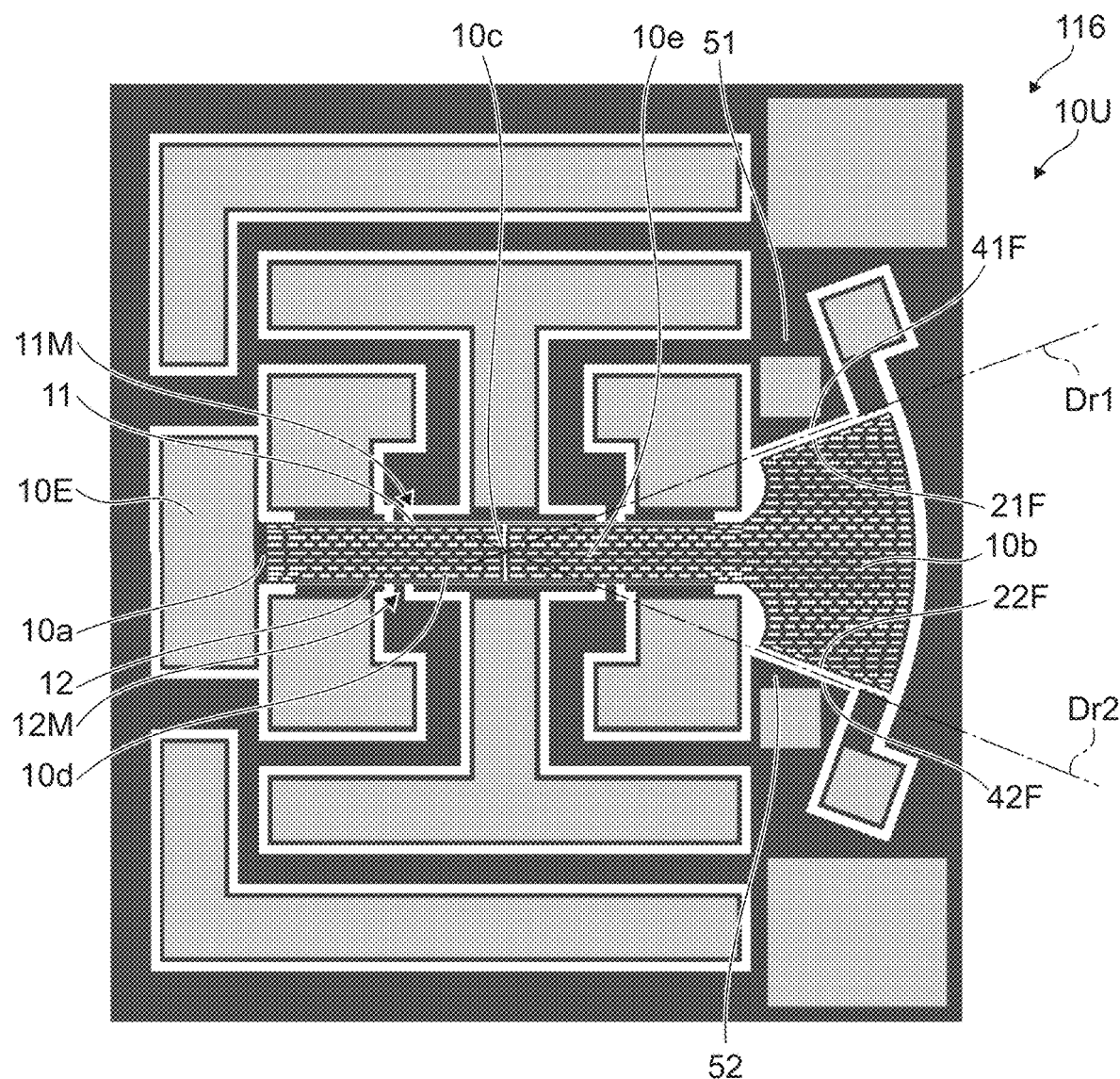
FIG. 16 is a schematic plan view illustrating a sensor according to the first embodiment.

FIGS. 15 and 16 are schematic plan views illustrating sensors according to the first embodiment.

As shown in FIGS. 15 and 16, also in a sensor 121 and a sensor 122 according to the embodiment, the second movable part 10b includes the first movable facing part 21F and the second movable facing part 22F. The first conductive part 51 includes the first conductive facing part 41F. The second conductive part 52 includes a second conductive facing part 42F.

The first movable facing part 21F faces the first conductive part 51 in the second plane (X-Y plane). The first conductive facing part 41F faces the first movable facing part 21F. The first movable facing part 21F and the first conductive facing part 41F extend along the first radial direction Dr1. The first radial direction Dr1 passes through the third movable part 10c and is along the second plane.

The second movable facing part 22F faces the second conductive part 52 in the second plane (X-Y plane). The second conductive facing part 42F faces the second movable facing part 22F. The second movable facing part 22F and the second conductive facing part 42F extend along the second radial direction Dr2. The second radial direction Dr2 passes through the third movable part 10c and is along the second plane. The detection accuracy can be improved also in the sensor 121 and the sensor 122.

As described above, in the sensors according to the embodiment, the rotation (displacement) of the second movable part 10b due to the acceleration can be obtained more stably. For example, when the second movable part 10b rotates, one of the tensile stress and the compressive stress acts on one of the first movable beam 11M and the second movable beam 12M, and the other of the tensile stress and the compressive stress acts on the other of the first movable beam 11M and the second movable beam 12M. The stress polarity is based on the direction of rotation. Due to the stress, the difference between the first resonance frequency of the first beam 11 and the second resonance frequency of the second beam 12 changes. In one example, in the case of clockwise rotation, the first resonant frequency increases and the second resonant frequency decreases. For example, in the case of counterclockwise rotation, the first resonance frequency decreases and the second resonance frequency increases. Stable rotation provides, for example, a stable change in resonance frequency. This makes it possible to provide, for example, a sensor capable of improving detection accuracy.

In the following, an example of the detection operation in the sensor according to the embodiment will be described.

For example, the controller 70 (see FIG. 1A) is configured to perform the first operation. In the first operation, the controller 70 receives the first signal sig1 (see FIG. 2A) obtained from the first fixed conductive part 61 and the second signal sig2 obtained from the second fixed conductive part 62 (see FIG. 2A). The controller 70 is configured to output information regarding the acceleration applied to the first detection element 10U and the temperature of the first detection element 10U based on the first signal sig1 and the second signal sig2. The first operation may include outputting a temperature-compensated acceleration. According to the embodiment, it is possible to provide a sensor capable of improving the detection accuracy. The controller 70 may include, for example, a processing circuit (for example, an electric circuit) such as a processing unit (for example, a CPU: Central Processing Unit).

The acceleration applied to the first detection element 10U causes a rotational displacement of the second movable part 10b. The first operation includes, for example, the first voltage application operation ST1 and the second voltage application operation ST2 as described above. By the first voltage application operation ST1 and the second voltage application operation ST2, it is possible to reduce (for example, cancel) the rotational displacement of the second movable part 10b due to acceleration. Based on the voltages applied in the first voltage application operation ST1 and the second voltage application operation ST2, information regarding the acceleration applied to the first detection element 10U and the temperature of the first detection element 10U can be obtained.

In one example, the first operation may include keeping the rotational displacement of the second movable part 10b substantially zero. Acceleration is detected by measuring the voltage that keeps the rotational displacement substantially zero. In a case where the first operation is performed, for example, when a large acceleration is applied to the first detection element 10U, the measurement can be performed without the second movable part 10b coming into contact with other side walls. For example, the range of measurable acceleration magnitudes increases.

For example, the first operation includes deriving information on the acceleration and temperature based on the difference and sum of the first resonance frequency of the first movable beam 11M and the second resonance frequency of the second movable beam 12M. The first resonance frequency is obtained from the first signal sig1. The second resonance frequency is obtained from the second signal sig2.

For example, the resonance frequency can be obtained by processing a signal with a PLL (phase locked loop) circuit. For example, the PLL circuit may be included in the controller 70. The PLL circuit may be provided separately from the controller 70.

For example, the first operation may include deriving information regarding the acceleration and temperature based on data on the relationship of the first resonance frequency, the second resonance frequency, the multiple accelerations, the multiple temperatures, the first voltage V1 and the second voltage V2. This data is stored in, for example, the storage part 70M (see FIG. 1A). The controller 70 acquires data from the storage part 70M that stores the data. For example, the first operation may include deriving information regarding the acceleration and temperature based on the acquired data.

Figure 17:
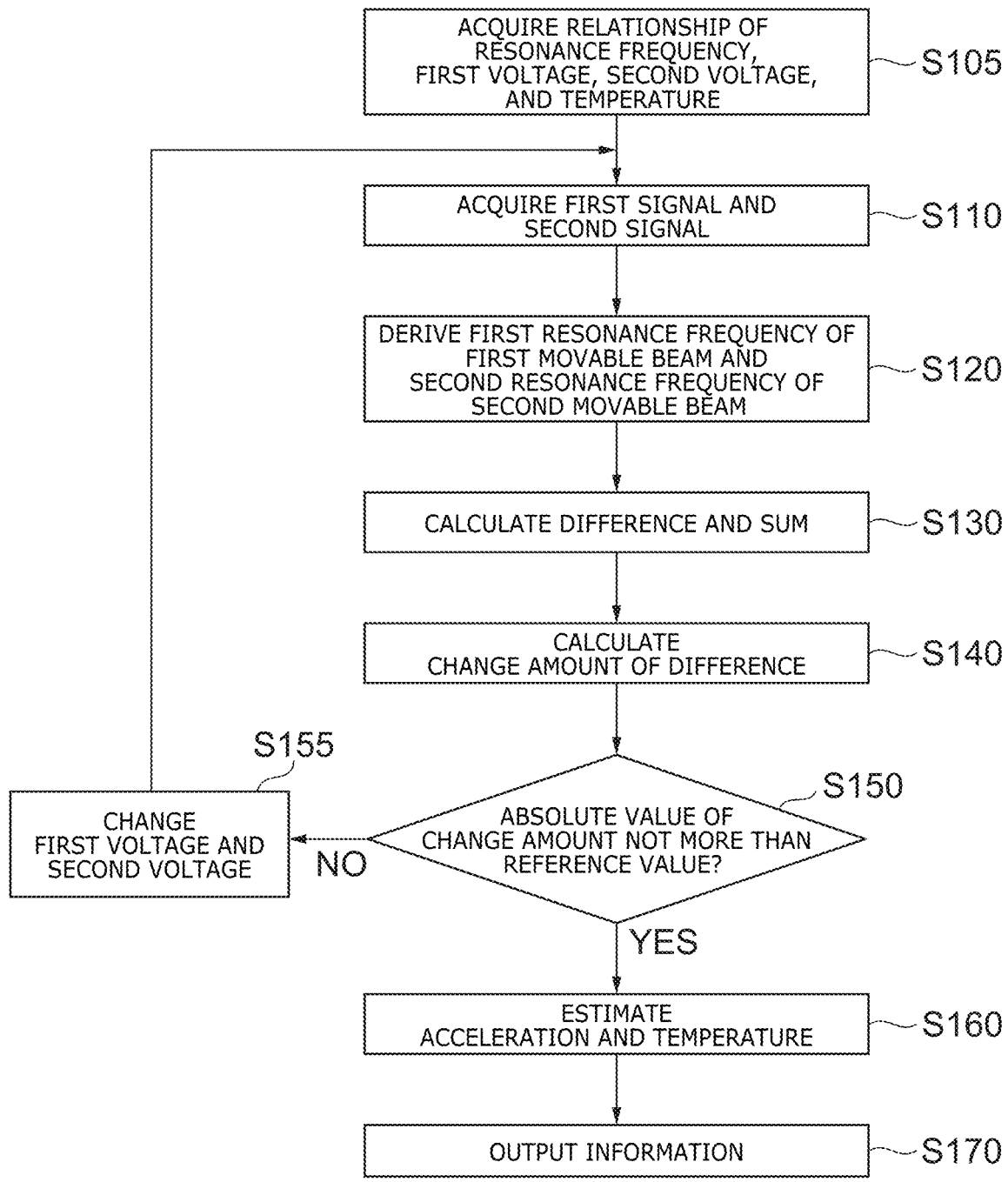
FIG. 17 is a flow chart illustrating the operation of the sensor according to the first embodiment.

FIG. 17 is a flowchart illustrating the operation of the sensor according to the first embodiment.

At least a portion of the operation shown in FIG. 17 is performed by the controller 70.

As shown in FIG. 17, data relating to the relationship of the resonance frequency (first resonance frequency $f_1$ and second resonance frequency $f_2$), the first voltage V1, the second voltage V2, the acceleration G, and the temperature T is acquired (Step S105). As described above, this data is acquired in advance. For example, the controller 70 may acquire the data stored in the storage part 70M.

As shown in FIG. 17, the controller 70 acquires the first signal sig1 obtained from the first fixed conductive part 61 and the second signal sig2 obtained from the second fixed conductive part 62 (step S110).

The controller 70 derives the first resonance frequency $f_1$ of the first movable beam 11M based on the first signal sig1, and derives the second resonance frequency $f_2$ of the second movable beam 12M based on the second signal sig2 (Step S120). As described above, the processing is performed by the PLL circuit or the like.

The controller 70 calculates the difference between the first resonance frequency $f_1$ and the second resonance frequency $f_2$ (resonance frequency difference) and the sum of the first resonance frequency $f_1$ and the second resonance frequency $f_2$ (resonance frequency sum) based on the first resonance frequency $f_1$ and the second resonance frequency $f_2$ (step S130).

The controller 70 calculates the amount of change in the above difference (resonance frequency difference) (step S140). The amount of change includes, for example, the difference between the difference obtained in step S130 and the initial difference. The amount of change includes, for example, the difference between the difference obtained in the latest step S130 and the difference obtained in the previous step S130.

The controller 70 determines whether or not the absolute value of the amount of change is equal to or less than the reference value (step S150). When the absolute value of the amount of change is larger than the reference value, the first voltage V1 and the second voltage V2 are changed (step S155), and the process proceeds to step S110. Steps S110 to S150 are repeated until the absolute value of the amount of change becomes equal to or less than the reference value.

When the absolute value of the amount of change is equal to or less than the reference value, the process proceeds to step S160. In step S160, the controller 70 estimates the acceleration G and the temperature T based on the first voltage V1 and the second voltage V2 (voltages in the first voltage application operation ST1 and the second voltage application operation ST2). The controller 70 outputs information regarding the acceleration G and the temperature T (step S170).

In this way, in the embodiment, the acceleration G and the temperature T can be output. In the embodiment, the first movable facing part 21F and the first conductive facing part 41F are provided. As a result, the second movable part 10b is possible to be displaced more effectively by the first voltage V1. In the embodiment, the first beam 11 and the second beam 12 are provided. In these beams, the resonance frequency changes according to the acceleration G. Highly accurate detection is possible by using the relationship of the acceleration, the temperature, the first voltage V1 and the second voltage V2. In the embodiment, for example, detection by force rebalancing may be performed. The controller 70 may be configured to control a potential (the first voltage V1) between the first movable member 10 and a first conductive part 51 so as to reduce a change amount of a difference between the first resonance frequency $f_1$ and the second resonance frequency $f_2$.

As described above, the first operation may include changing the first voltage V1 to reduce the difference between the first resonance frequency $f_1$ and the second resonance frequency $f_2$. For example, the first voltage V1 may be applied to the conductive part so that the difference between the first resonance frequency $f_1$ and the second resonance frequency $f_2$ becomes substantially zero. Data regarding the relationship of the first voltage V1, the first resonance frequency $f_1$, the second resonance frequency $f_2$, the acceleration G, and the temperature T in this state may be acquired in advance. The data acquired in advance is stored in, for example, the storage part 70M. The controller 70 is possible to calculate (estimate) the acceleration G and the temperature T based on the stored data.

As described above, in the first operation, the controller 70 is possible to output the acceleration G and the temperature T when the amount of change in the difference between the first resonance frequency $f_1$ and the second resonance frequency $f_2$ becomes smaller than the reference value as the acceleration G applied to the first detection element 10U and the temperature T of the first detection element 10U.

In the following, an example of acquiring data relating to the relationship of the first resonance frequency $f_1$, the second resonance frequency $f_2$, the acceleration G, the temperature T, the first voltage V1, and the second voltage V2 will be described. The second voltage V2 may be 0. In this case, the description regarding the second voltage V2 is omitted. In this case, the first voltage V1 may be the "difference between the first voltage V1 and the second voltage V2".

Figure 18:
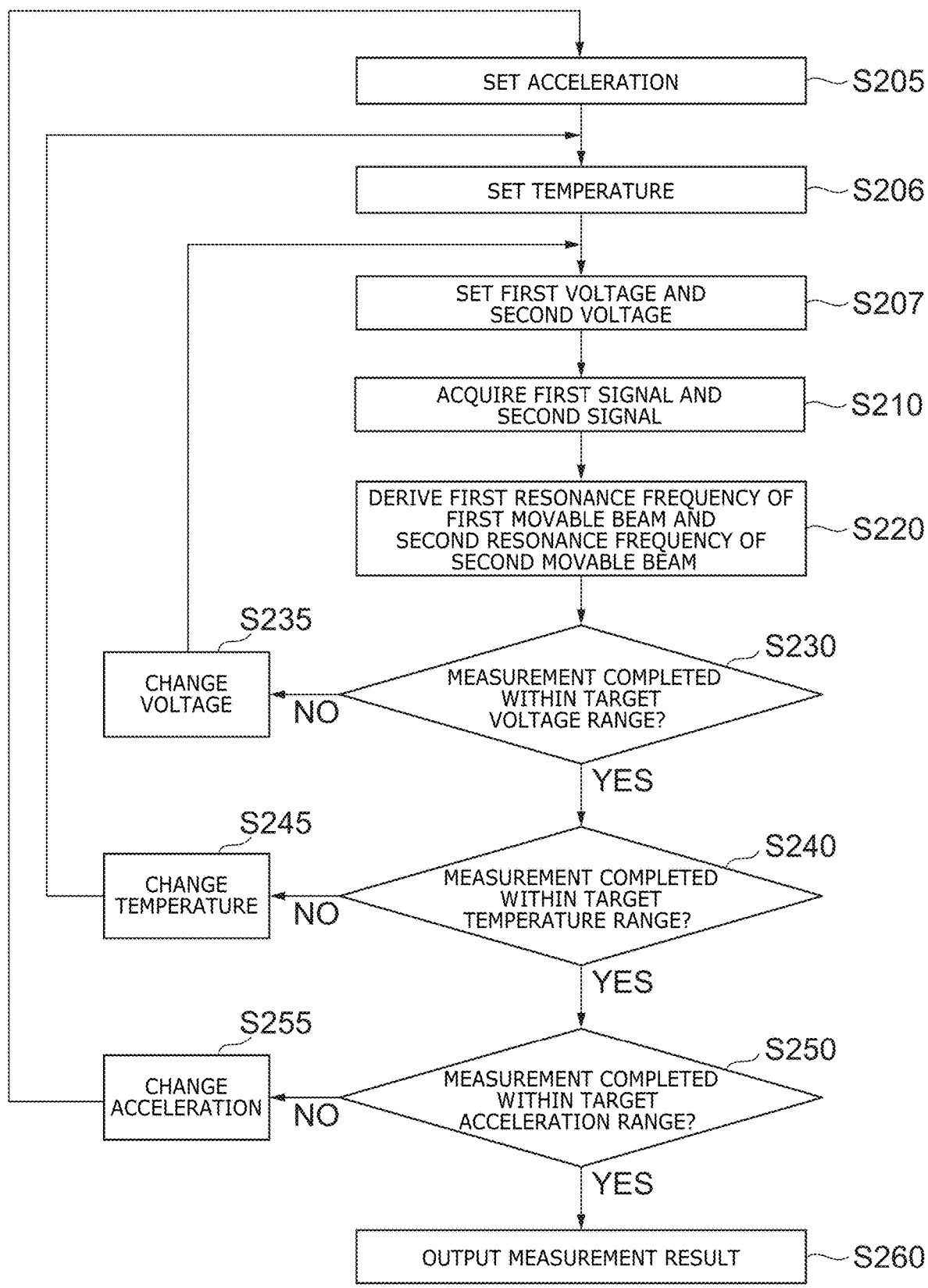
FIG. 18 is a flow chart illustrating the operation of the sensor according to the first embodiment.

FIG. 18 is a flowchart illustrating the operation of the sensor according to the first embodiment.

At least a portion of the operation shown in FIG. 18 may be performed by the controller 70. The operation shown in FIG. 18 may be performed by another controller, and the obtained data may be stored in the storage part 70M or the like.

As shown in FIG. 18, the acceleration G is set (step S205). For example, in the first operation, the acceleration G is set to 0.

The temperature T is set (step S206). For example, the temperature of the first detection element 10U is set to one of several temperatures within the target temperature range. The target temperature range is, for example, the operating temperature range of the sensor. The target temperature range is, for example, not lower than −20° C. and not higher than 80° C.

The first voltage V1 and the second voltage V2 (voltages in the first voltage application operation ST1 and the second voltage application operation ST2) are set (step S207). These voltage settings are, for example, the control range of the first voltage V1. The control range is, for example, not less than 0 V and not more than 40 V.

The first signal sig1 obtained from the first fixed conductive part 61 and the second signal sig2 obtained from the second fixed conductive part 62 are acquired (step S210).

The first resonance frequency $f_1$ of the first movable beam 11M is calculated based on the first signal sig1, and the second resonance frequency $f_2$ of the second movable beam 12M is calculated based on the second signal sig2 (step S220). As described above, the processing is performed by the PLL circuit or the like.

It is determined whether or not the measurement within the target voltage range is completed (step S230). When the measurement within the target voltage range is not completed, the process proceeds to step S235. In step S235, the first voltage V1 and the second voltage V2 are changed, and the process returns to step S207.

When the measurement within the target voltage range is completed, it is determined whether or not the measurement within the target temperature range is completed (step S240). When the measurement within the target temperature range is not completed, the process proceeds to step S245. In step S245, the temperature of the first detection element 10U is changed, and the process returns to step S206.

When the measurement within the target temperature range is completed, the process proceeds to step S250. In step S250, it is determined whether or not the measurement within the target acceleration range is completed. When the measurement within the target acceleration range is not completed, the process proceeds to step S255. The acceleration is changed in step S255. Then, the process returns to step S205.

When the measurement within the target acceleration range is completed, the measurement result is stored (step S260).

For example, the operation of FIG. 18 may be performed under 27 types of conditions of three types of acceleration G, three types of temperature T, and three types of first voltage V1. The three types of acceleration G include, for example, −1 G, 0 G, and +1 G. The three types of temperature T include −20° C., +20° C. and +80° C. The three types of first voltage V1 (which may be the difference between the first voltage V1 and the second voltage V2) include 0V, 20V, and 40V.

By the operation like this, for example, data regarding the relationship of the first resonance frequency $f_1$, the second resonance frequency $f_2$, the acceleration G, the temperature T, and the drive/adjustment voltage is acquired and stored. Using the acquired and stored data, the operation described with respect to FIG. 17 is performed.

Second Embodiment

Figure 19:
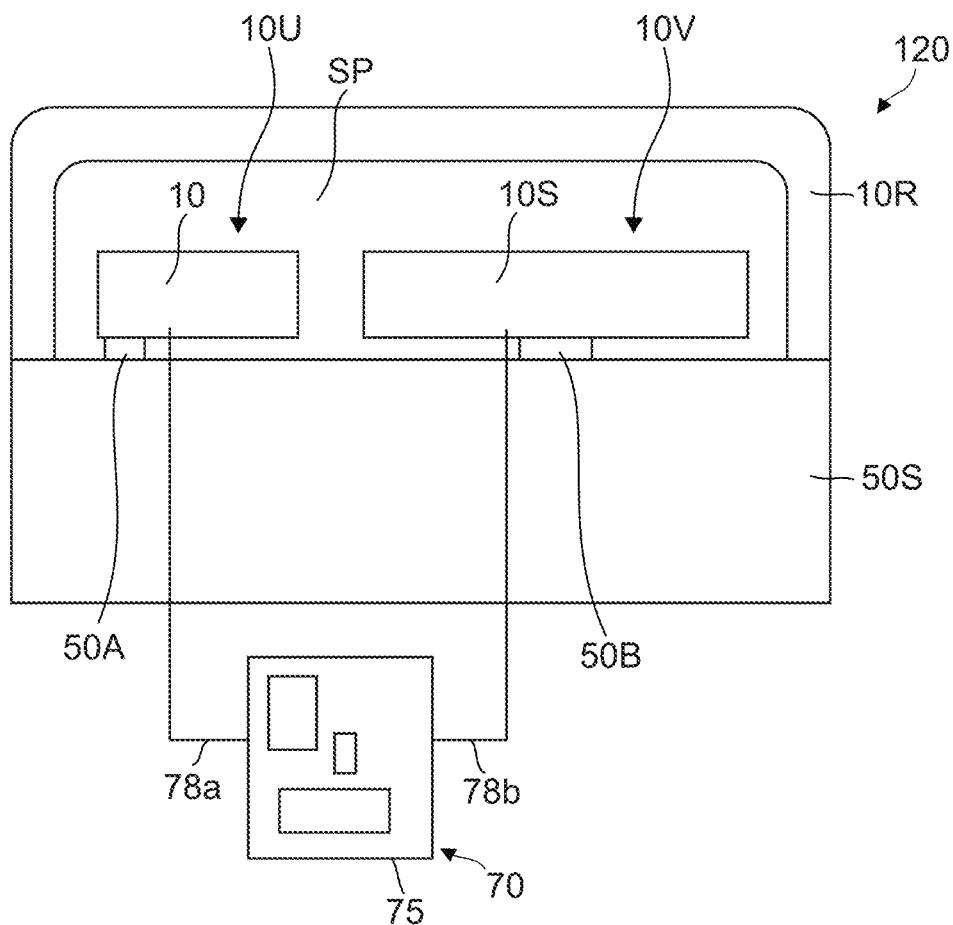
FIG. 19 is a schematic cross-sectional view illustrating a sensor according to a second embodiment.

FIG. 19 is a schematic cross-sectional view illustrating a sensor according to a second embodiment.

As shown in FIG. 19, a sensor 120 according to the embodiment includes a second detection element 10V in addition to the first detection element 10U. The second detection element 10V includes, for example, a second support member 50B and a second movable member 10S. The second support member 50B is fixed to the base body 50S. The second movable member 10S is supported by the second support member 50B and is separated from the base body 50S. The sensor 120 is configured to detect the angle of the sensor 120 based on a signal corresponding to the movement of the second movable member 10S. For example, at least a portion of the second movable member 10S is vibrated. The angle can be detected by detecting the vibration state that changes according to the change of the angle. For example, the angle is detected based on the principle of Foucault's pendulum. The second movable member 10S is, for example, a rate integrating gyroscope (RIG). The sensor 120 is, for example, an inertial measurement unit (IMU).

The configuration described in reference to the first embodiment is applicable to the configuration of the base body 50S, the first support member 50A, the first movable member 10, etc., of the sensor 120.

As shown in FIG. 19, a lid part 10R may be provided in the sensor 120. The lid part 10R is connected to the base body 50S. The first support member 50A, the first movable member 10, the second support member 50B, and the second movable member 10S are between the base body 50S and the lid part 10R. For example, a space SP that is surrounded with the base body 50S and the lid part 10R is less than 1 atmosphere. By depressurizing the space SP, the detection can be performed with higher accuracy. The space SP is, for example, not more than 0.1 Pa.

As shown in FIG. 19, an electrical signal that is obtained from the first movable member 10 and an electrical signal that is obtained from the second movable member 10S may be supplied to a processing circuit 75. For example, the first movable member 10 and the processing circuit 75 are electrically connected by wiring 78a. The second movable member 10S and the processing circuit 75 are electrically connected by wiring 78b. The processing circuit 75 is, for example, a PLL circuit. For example, the processing circuit 75 is included in the controller 70. The change of the resonant frequency obtained from the first movable member 10 can be detected by the processing circuit 75. For example, the acceleration can be detected thereby. The change of the resonant frequency obtained from the second movable member 10S can be detected by the processing circuit 75. For example, the angle can be detected thereby. The angular velocity may be detected. A small sensor is obtained.

Third Embodiment

A third embodiment relates to an electronic device.

Figure 20:
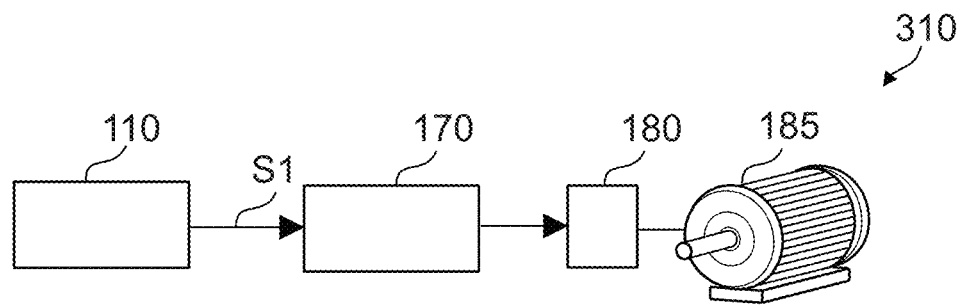
FIG. 20 is a schematic view illustrating an electronic device according to a third embodiment.

FIG. 20 is a schematic view illustrating the electronic device according to the third embodiment.

As shown in FIG. 20, an electronic device 310 according to the third embodiment includes a circuit controller 170 and the sensor according to the first or second embodiment. The sensor 110 is illustrated as the sensor in the example of FIG. 12. The circuit controller 170 is configured to control a circuit 180 based on a signal S1 obtained from the sensor. The circuit 180 is, for example, a control circuit of a drive device 185, etc. According to the embodiment, the circuit 180 for controlling the drive device 185 and the like can be controlled with high accuracy based on the high-accuracy detection result.

FIGS. 21A to 21H are schematic views illustrating applications of the electronic device.

As shown in FIG. 21A, the electronic device 310 may be at least a portion of a robot. As shown in FIG. 21B, the electronic device 310 may be at least a portion of a machining robot provided in a manufacturing plant, etc. As shown in FIG. 21C, the electronic device 310 may be at least a portion of an automatic guided vehicle inside a plant, etc. As shown in FIG. 21D, the electronic device 310 may be at least a portion of a drone (an unmanned aircraft). As shown in FIG. 21E, the electronic device 310 may be at least a portion of an airplane. As shown in FIG. 21F, the electronic device 310 may be at least a portion of a ship. As shown in FIG. 21G, the electronic device 310 may be at least a portion of a submarine. As shown in FIG. 21H, the electronic device 310 may be at least a portion of an automobile. The electronic device 310 according to the third embodiment may include, for example, at least one of a robot or a moving body.

Fourth Embodiment

Figure 22A:
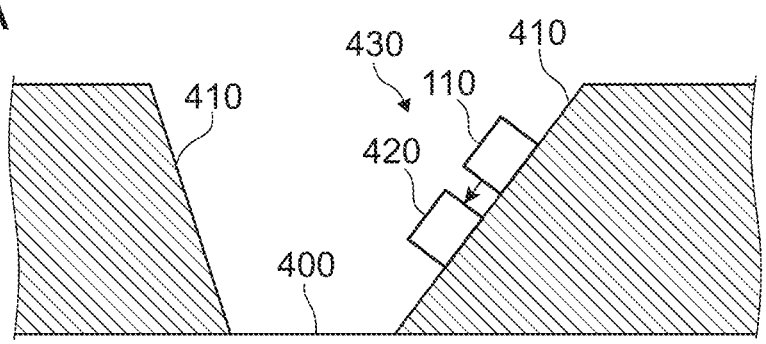
FIGS. 22A to 22B are schematic views illustrating a sensor according to a fourth embodiment.
Figure 22B:
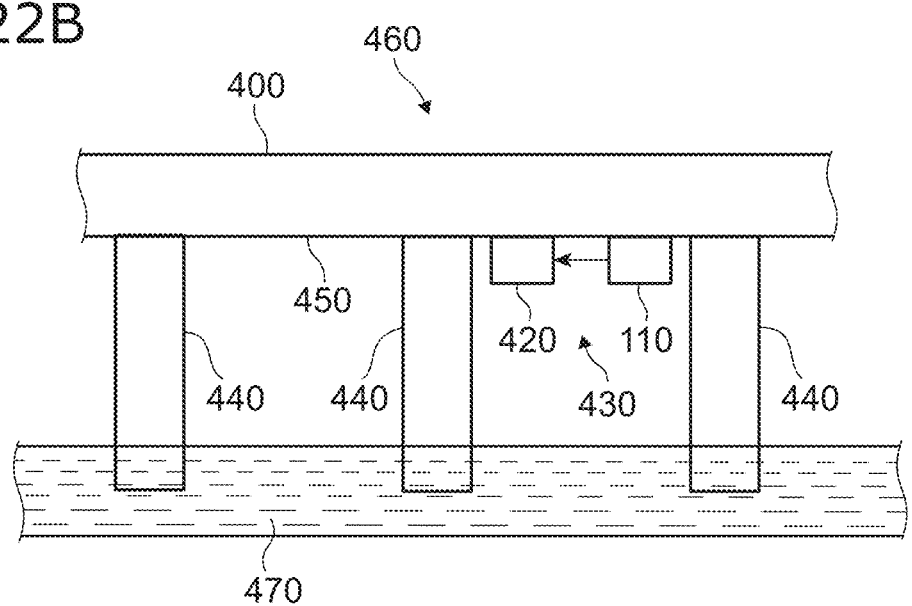

FIGS. 22A and 22B are schematic views illustrating a sensor according to the fourth embodiment.

As shown in FIG. 22A, a sensor 430 according to the fourth embodiment includes the sensor according to the first embodiment or the second embodiment, and a transmission/reception part 420. In the example of FIG. 22A, the sensor 110 is illustrated as the sensor. The transmission/reception part 420 is configured to transmit the signal obtained from the sensor 110 by, for example, at least one of wireless and wired methods. The sensor 430 is provided on, for example, a slope surface 410 such as a road 400. The sensor 430 can monitor the state of, for example, a facility (e.g., infrastructure). The sensor 430 may be, for example, a state monitoring device.

For example, the sensor 430 detects a change in the state of a slope surface 410 of a road 400 with high accuracy. The change in the state of the slope surface 410 includes, for example, at least one of a change in the inclination angle and a change in the vibration state. The signal (inspection result) obtained from the sensor 110 is transmitted by the transmission/reception part 420. The status of a facility (e.g., infrastructure) can be monitored, for example, continuously.

As shown in FIG. 22B, the sensor 430 is provided, for example, in a portion of a bridge 460. The bridge 460 is provided above the river 470. For example, the bridge 460 includes at least one of a main girder 450 and a pier 440. The sensor 430 is provided on at least one of the main girder 450 and the pier 440. For example, at least one of the angles of the main girder 450 and the pier 440 may change due to deterioration or the like. For example, the vibration state may change in at least one of the main girder 450 and the pier 440. The sensor 430 detects these changes with high accuracy. The detection result can be transmitted to an arbitrary place by the transmission/reception part 420. Abnormalities can be detected effectively.

Embodiments include, for example, the following configurations (e.g., technological proposals).

Configuration 1

A sensor, comprising:
a first detection element including
a base body,
a first support member fixed to the base body,
a conductive first movable member, and
a first conductive part fixed to the base body, the first movable member including a first movable part, a second movable part, a third movable part, a fourth movable part and a fifth movable part, in a second direction crossing a first direction from the base body toward the first movable member, the third movable part being between the first movable part and the second movable part, in the second direction, the fourth movable part being between the first movable part and the third movable part, in the second direction, the fifth movable part being between the third movable part and the second movable part, the first movable part being supported by the first support member, and the second movable part, the third movable part, the fourth movable part and the fifth movable part being separated from the base body, a first width along a third direction of the first movable part being larger than a fourth width along the third direction of the fourth movable part and larger than a fifth width along the third direction of the fifth movable part, the third direction crossing a first plane including the first direction and the second direction, a third width of the third movable part being smaller than the fourth width and smaller than the fifth width, a third length along the second direction of the third movable part being shorter than a fourth length along the second direction of the fourth movable part and shorter than a fifth length along the second direction of the fifth movable part, the second movable part including a first movable facing part facing the first conductive part in a second plane including the second direction and the third direction, the first movable facing part including a first movable protrusion portion protruding toward the first conductive part, the first conductive part including a first conductive facing part facing the first movable facing part, the first conductive facing part including a first conductive protrusion portion protruding toward the first movable facing part, and the first conductive protrusion portion overlapping the first movable protrusion portion in a first radiation direction passing through the third movable part and being along the second plane.

Configuration 2
The sensor according to Configuration 1, wherein
the first movable facing part includes a plurality of the first movable protrusion portions,
the first conductive part includes a plurality of the first conductive protrusion portions, and
one of the first conductive protrusion portions is between one of the first movable protrusion portions and another one of the first movable protrusion portions in the first radiation direction.

Configuration 3
The sensor according to Configuration 2, wherein
the first movable protrusion portions are arranged along a first movable radiation direction passing through the third movable part and being along the second plane, and
the first conductive protrusion portions are arranged along a first conductive radiation direction passing through the third movable part and being along the second plane.

Configuration 4
The sensor according to Configuration 3, wherein
a length along a first movable arc direction of the first movable protrusion portions increases in proportion to a distance of the first movable protrusion portions from the third movable part, and the first movable arc direction is along the second plane and crosses the first movable radiation direction, and
a length along a first conductive arc direction of the first conductive protrusion portions increases in proportion to a distance of the first conductive protrusion portions from the third movable part, and the first conductive arc direction is along the second plane and crosses the first conductive radiation direction.

Configuration 5
The sensor according to Configuration 1, wherein
the first movable facing part includes a plurality of the first movable protrusion portions,
the first movable protrusion portions are arranged along a first movable radiation direction passing through the third movable part and being along the second plane,
a distance between the one of the first movable protrusion portions and the third movable part is longer than a distance between another one of the first movable protrusion portions and the third movable part, and
a length along a first movable arc direction of the one of the first movable protrusion portions is longer than a length along the first movable arc direction of the other one of the first movable protrusion portions, and the first movable arc direction is along the second plane and crosses the first movable radiation direction.

Configuration 6
The sensor according to Configuration 5, wherein
the first conductive facing part includes a plurality of the first conductive protrusion portions,
one of the first conductive protrusion portions is between one of the first movable protrusion portions and another one of the first movable protrusion portions in the first radiation direction,
the first conductive protrusion portions are arranged along a first conductive radiation direction passing through the third conductive part and being along the second plane,
a distance between one of the first conductive protrusion portions and the third conductive part is longer than a distance between another one of the first conductive protrusion portions and the third conductive part, and
a length along the first conductive arc direction of the one of the first conductive protrusion portions is longer than a length along the first conductive arc direction of the other one of the first conductive protrusion portions, and the first conductive arc direction is along the second plane and crosses the first conductive radiation direction.

Configuration 7
The sensor according to any one of Configurations 1 to 6, wherein
the first detection element further includes a second conductive part fixed to the base body,
the second movable part includes a second movable facing part facing the second conductive part in the second plane, and the second movable facing part includes a second movable protrusion portion protruding toward the second conductive part,
the second conductive part includes a second conductive facing part facing the second movable facing part, and the second conductive facing part includes a second conductive protrusion portion protruding toward the second movable facing part, and the second conductive protrusion portion overlaps the second movable protrusion portion in a second radiation direction passing through the third movable part and being along the second plane.

Configuration 8

The sensor according to Configuration 7, wherein at least a portion of the second movable part is between the first conductive part and the second conductive part.

Configuration 9

The sensor according to Configuration 7 or 8, wherein the second movable facing part includes a plurality of the second movable protrusion portions,
the second movable protrusion portions are arranged along a second movable radiation direction passing through the third movable part and being along the second plane,
a distance between one of the second movable protrusion portions and the third movable part is longer than a distance between another one of the second movable protrusion portions and the third movable part, and
a length along a second movable arc direction of the one of the second movable protrusion portions is longer than a length along the second movable arc direction of the other one of the second movable protrusion portions, and the second movable arc direction is along the second plane and crosses the second movable radiation direction.

Configuration 10

The sensor according to Configuration 9, wherein
the second conductive facing part includes a plurality of the second conductive protrusion portions,
one of the second conductive protrusion portions is between one of the second movable protrusion portions and another one of the second movable protrusion portions in the second radiation direction,
the second conductive protrusion portions are arranged along a second conductive radiation direction passing through the third movable part and being along the second plane,
a distance between one of the second conductive protrusion portions and the third movable part is longer than a distance between another one of the second conductive protrusion portions and the third movable part, and
a length along a second conductive arc direction of the one of the second conductive protrusion portions is longer than a length along the second conductive arc direction of the other one of the second conductive protrusion portions, and the second conductive arc direction is along the second plane and crosses the second conductive radiation direction.

Configuration 11

The sensor according to any one of Configurations 7 to 10, wherein
the first detection element further includes a third conductive part fixed to the base body,
the second movable part includes a third movable facing part facing the third conductive part in the second plane, and the third movable facing part includes a third movable protrusion portion protruding toward the third movable facing part,
the third conductive part includes a third conductive facing part facing the third movable facing part, and the third conductive facing part includes a third conductive protrusion portion protruding toward the third movable facing part,
the third conductive protrusion portion overlaps the third movable protrusion portion in a third radiation direction passing through the third moving part and being along the second plane, and
at least a portion of the second movable part is between the first conductive part and the third conductive part in an arc direction centered on the third movable part.

Configuration 12

The sensor according to Configuration 11, wherein
the first detection element further includes a fourth conductive part fixed to the base body,
the second movable part includes a fourth movable facing part facing the fourth conductive part in the second plane, and the fourth movable facing part includes a fourth movable protrusion portion protruding toward the fourth movable facing part,
the fourth conductive part includes a fourth conductive facing part facing the fourth movable facing part, and the fourth conductive facing part includes a fourth conductive protrusion portion protruding toward the fourth movable facing part,
the fourth conductive protrusion portion overlaps the fourth movable protrusion portion in a fourth radiation direction passing through the third moving part and being along the second plane, and
at least a portion of the second movable part is between the second conductive part and the fourth conductive part in the arc direction centered on the third movable part.

Configuration 13

The sensor according to Configuration 12, wherein
at least a portion of the third conductive part is between the first conductive part and the second conductive part,
at least a portion of the fourth conductive part is between the third conductive part and the second conductive part,
the third conductive part is electrically connected to the first conductive part, and
the fourth conductive part is electrically connected to the second conductive part.

Configuration 14

The sensor according to any one of Configurations 11 to 13, wherein
the second movable part is around at least a portion of the third conductive part in the second plane.

Configuration 15

A sensor, comprising:
a first detection element including
a base body,
a first support member fixed to the base body,
a conductive first movable member, and
a first conductive part fixed to the base body,
the first movable member including a first movable part, a second movable part, a third movable part, a fourth movable part and a fifth movable part,
in a second direction crossing a first direction from the base body toward the first movable member, the third movable part being between the first movable part and the second movable part, in the second direction, the fourth movable part being between the first movable part and the third movable part, in the second direction, the fifth movable part being between the third movable part and the second movable part,
the first movable part being supported by the first support member, and the second movable part, the third movable part, the fourth movable part and the fifth movable part being separated from the base body, a first width along a third direction of the first movable part being larger than a fourth width along the third direction of the fourth movable part and larger than a fifth width along the third direction of the fifth movable part, the third direction crossing a first plane including the first direction and the second direction, a third width of the third movable part being smaller than the fourth width and smaller than the fifth width, a third length along the second direction of the third movable part being shorter than a fourth length along the second direction of the fourth movable part and shorter than a fifth length along the second direction of the fifth movable part, the second movable part including a first movable facing part facing the first conductive part in a second plane including the second direction and the third direction, the first conductive part including a first conductive facing part facing the first movable facing part, and the first movable facing part and the first conductive facing part extending along a first radiation direction passing through the third movable part and being along the second plane.

Configuration 16

The sensor according to any one of Configurations 1 to 15, wherein the first movable member includes a first beam and a second beam, the first beam includes a first end portion and a first other end portion, the first end portion is connected to the first movable part, and the first other end portion is connected to the second movable part, the second beam includes a second end portion and a second other end portion, the second end portion is connected to the first movable part, and the second other end portion is connected to the second movable part, the third movable part is between the first beam and the second beam in the third direction, and at least one of a first resonance frequency of the first beam or a second resonance frequency of the second beam is configured to change according to a displacement of the second movable part in accordance with a received acceleration.

Configuration 17

The sensor according to Configuration 16, further comprising:

a controller, the first movable member including a first fixed conductive part facing the first beam, and
a second conductive part facing the second beam, the controller being electrically connected to the first fixed conductive part and the second conductive part, and the controller being configured to derive the first resonance frequency and the second resonance frequency based on a first signal obtained from the first fixed conductive part and a second signal obtained from the second fixed conductive part.

Configuration 18

The sensor according to Configuration 17, wherein the first movable member includes a fifth conductive part facing the first beam and a sixth conductive part facing the second beam, the controller is electrically connected to the fifth conductive part and the sixth conductive part, the controller is configured to control a potential difference between the first movable part and the first conductive part so as to reduce a change amount of a difference between the first resonance frequency and the second resonance frequency.

Configuration 19

The sensor according to any one of Configurations 1 to 18, further comprising:

a second detection element including a second support member, and
a second movable member supported by the second support member and separated from the base body, an angle being configured to be detected from a signal corresponding to a movement of the second movable member.

Configuration 20

An electronic device, comprising:

the sensor according to any one of Configurations 1 to 19; and a circuit controller configured to control a circuit based on a signal obtained from the sensor.

According to embodiments, a sensor and an electronic device can be provided in which the detection accuracy can be increased.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in sensors such as base bodies, supporters, movable parts, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all sensors, and electronic devices practicable by an appropriate design modification by one skilled in the art based on the sensors, and the electronic devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A sensor, comprising:
a first detection element including
a base body,
a first support member fixed to the base body,
a conductive first movable member, and
a first conductive part fixed to the base body,
the first movable member including a first movable part, a second movable part, a third movable part, a fourth movable part and a fifth movable part, in a second direction crossing a first direction from the base body toward the first movable member, the third movable part being between the first movable part and the second movable part, in the second direction, the fourth movable part being between the first movable part and the third movable part, in the second direction, the fifth movable part being between the third movable part and the second movable part, the first movable part being supported by the first support member, and the second movable part, the third movable part, the fourth movable part and the fifth movable part being separated from the base body, a first width along a third direction of the first movable part being larger than a fourth width along the third direction of the fourth movable part and larger than a fifth width along the third direction of the fifth movable part, the third direction crossing a first plane including the first direction and the second direction, a third width of the third movable part being smaller than the fourth width and smaller than the fifth width, a third length along the second direction of the third movable part being shorter than a fourth length along the second direction of the fourth movable part and shorter than a fifth length along the second direction of the fifth movable part, the second movable part including a first movable facing part facing the first conductive part in a second plane including the second direction and the third direction, the first movable facing part including a first movable protrusion portion protruding toward the first conductive part, the first conductive part including a first conductive facing part facing the first movable facing part, the first conductive facing part including a first conductive protrusion portion protruding toward the first movable facing part, and the first conductive protrusion portion overlapping the first movable protrusion portion in a first radiation direction passing through the third movable part and being along the second plane, wherein the first detection element further includes a second conductive part fixed to the base body, the second movable part includes a second movable facing part facing the second conductive part in the second plane, and the second movable facing part includes a second movable protrusion portion protruding toward the second conductive part, the second conductive part includes a second conductive facing part facing the second movable facing part, and the second conductive facing part includes a second conductive protrusion portion protruding toward the second movable facing part, the second conductive protrusion portion overlaps the second movable protrusion portion in a second radiation direction passing through the third movable part and being along the second plane, the first detection element further includes a third conductive part fixed to the base body, the second movable part includes a third movable facing part facing the third conductive part in the second plane, and the third movable facing part includes a third movable protrusion portion protruding toward the third movable facing part, the third conductive part includes a third conductive facing part facing the third movable facing part, and the third conductive facing part includes a third conductive protrusion portion protruding toward the third movable facing part, the third conductive protrusion portion overlaps the third movable protrusion portion in a third radiation direction passing through the third moving part and being along the second plane, and at least a portion of the second movable part is between the first conductive part and the third conductive part in an arc direction centered on the third movable part, the first detection element further includes a fourth conductive part fixed to the base body, the second movable part includes a fourth movable facing part facing the fourth conductive part in the second plane, and the fourth movable facing part includes a fourth movable protrusion portion protruding toward the fourth movable facing part, the fourth conductive part includes a fourth conductive facing part facing the fourth movable facing part, and the fourth conductive facing part includes a fourth conductive protrusion portion protruding toward the fourth movable facing part, the fourth conductive protrusion portion overlaps the fourth movable protrusion portion in a fourth radiation direction passing through the third moving part and being along the second plane, and at least a portion of the second movable part is between the second conductive part and the fourth conductive part in the arc direction centered on the third movable part, at least a portion of the third conductive part is between the first conductive part and the second conductive part, at least a portion of the fourth conductive part is between the third conductive part and the second conductive part, the third conductive part is electrically connected to the first conductive part, and the fourth conductive part is electrically connected to the second conductive part.

2. The sensor according to claim 1, wherein
the first movable facing part includes a plurality of the first movable protrusion portions,
the first conductive part includes a plurality of the first conductive protrusion portions, and
one of the first conductive protrusion portions is between one of the first movable protrusion portions and another one of the first movable protrusion portions in the first radiation direction.

3. The sensor according to claim 2, wherein
the first movable protrusion portions are arranged along a first movable radiation direction passing through the third movable part and being along the second plane, and
the first conductive protrusion portions are arranged along a first conductive radiation direction passing through the third movable part and being along the second plane.

4. The sensor according to claim 3, wherein
a length along a first movable arc direction of the first movable protrusion portions increases in proportion to a distance of the first movable protrusion portions from the third movable part, and the first movable arc direction is along the second plane and crosses the first movable radiation direction, and a length along a first conductive arc direction of the first conductive protrusion portions increases in proportion to a distance of the first conductive protrusion portions from the third movable part, and the first conductive arc direction is along the second plane and crosses the first conductive radiation direction.

5. The sensor according to claim 1, wherein the first movable facing part includes a plurality of the first movable protrusion portions, the first movable protrusion portions are arranged along a first movable radiation direction passing through the third movable part and being along the second plane, a distance between the one of the first movable protrusion portions and the third movable part is longer than a distance between another one of the first movable protrusion portions and the third movable part, and a length along a first movable arc direction of the one of the first movable protrusion portions is longer than a length along the first movable arc direction of the other one of the first movable protrusion portions, and the first movable arc direction is along the second plane and crosses the first movable radiation direction.

6. The sensor according to claim 5, wherein the first conductive facing part includes a plurality of the first conductive protrusion portions, one of the first conductive protrusion portions is between one of the first movable protrusion portions and another one of the first movable protrusion portions in the first radiation direction, the first conductive protrusion portions are arranged along a first conductive radiation direction passing through the third conductive part and being along the second plane, a distance between one of the first conductive protrusion portions and the third conductive part is longer than a distance between another one of the first conductive protrusion portions and the third conductive part, and a length along the first conductive arc direction of the one of the first conductive protrusion portions is longer than a length along the first conductive arc direction of the other one of the first conductive protrusion portions, and the first conductive arc direction is along the second plane and crosses the first conductive radiation direction.

7. The sensor according to claim 1, wherein the second movable facing part includes a plurality of the second movable protrusion portions, the second movable protrusion portions are arranged along a second movable radiation direction passing through the third movable part and being along the second plane, a distance between one of the second movable protrusion portions and the third movable part is longer than a distance between another one of the second movable protrusion portions and the third movable part, and a length along a second movable arc direction of the one of the second movable protrusion portions is longer than a length along the second movable arc direction of the other one of the second movable protrusion portions, and the second movable arc direction is along the second plane and crosses the second movable radiation direction.

8. The sensor according to claim 7, wherein the second conductive facing part includes a plurality of the second conductive protrusion portions, one of the second conductive protrusion portions is between one of the second movable protrusion portions and another one of the second movable protrusion portions in the second radiation direction, the second conductive protrusion portions are arranged along a second conductive radiation direction passing through the third movable part and being along the second plane, a distance between one of the second conductive protrusion portions and the third movable part is longer than a distance between another one of the second conductive protrusion portions and the third movable part, and a length along a second conductive arc direction of the one of the second conductive protrusion portions is longer than a length along the second conductive arc direction of the other one of the second conductive protrusion portions, and the second conductive arc direction is along the second plane and crosses the second conductive radiation direction.

9. The sensor according to claim 1, wherein the second movable part is around at least a portion of the third conductive part in the second plane.

10. The sensor according to claim 1, further comprising:

a second detection element including
  a second support member, and
  a second movable member supported by the second support member and separated from the base body,
an angle being configured to be detected from a signal corresponding to a movement of the second movable member.

11. An electronic device, comprising:

the sensor according to claim 1; and a circuit controller configured to control a circuit based on a signal obtained from the sensor.

12. The sensor according to claim 1, wherein the first movable member includes a first beam and a second beam, the first beam includes a first end portion and a first other end portion, the first end portion is connected to the first movable part, and the first other end portion is connected to the second movable part, the second beam includes a second end portion and a second other end portion, the second end portion is connected to the first movable part, and the second other end portion is connected to the second movable part, the third movable part is between the first beam and the second beam in the third direction, and at least one of a first resonance frequency of the first beam or a second resonance frequency of the second beam is configured to change according to a displacement of the second movable part in accordance with a received acceleration.

13. The sensor according to claim 12, further comprising:

a controller, the first movable member including
  a first fixed conductive part facing the first beam, and
  a second conductive part facing the second beam, the controller being electrically connected to the first fixed conductive part and the second conductive part, and the controller being configured to derive the first resonance frequency and the second resonance frequency based on a first signal obtained from the first fixed conductive part and a second signal obtained from the second fixed conductive part.

14. The sensor according to claim 13, wherein
the first movable member includes a fifth conductive part facing the first beam and a sixth conductive part facing the second beam,
the controller is electrically connected to the fifth conductive part and the sixth conductive part,
the controller is configured to control a potential difference between the first movable part and the first conductive part so as to reduce a change amount of a difference between the first resonance frequency and the second resonance frequency.

15. The sensor according to claim 12, further comprising:
a second detection element including
a second support member, and
a second movable member supported by the second support member and separated from the base body,
an angle being configured to be detected from a signal corresponding to a movement of the second movable member.

16. A sensor, comprising:
a first detection element including
a base body,
a first support member fixed to the base body,
a conductive first movable member, and
a first conductive part fixed to the base body,
the first movable member including a first movable part, a second movable part, a third movable part, a fourth movable part and a fifth movable part,
in a second direction crossing a first direction from the base body toward the first movable member, the third movable part being between the first movable part and the second movable part, in the second direction, the fourth movable part being between the first movable part and the third movable part, in the second direction, the fifth movable part being between the third movable part and the second movable part,
the first movable part being supported by the first support member, and the second movable part, the third movable part, the fourth movable part and the fifth movable part being separated from the base body,
a first width along a third direction of the first movable part being larger than a fourth width along the third direction of the fourth movable part and larger than a fifth width along the third direction of the fifth movable part, the third direction crossing a first plane including the first direction and the second direction, a third width of the third movable part being smaller than the fourth width and smaller than the fifth width, a third length along the second direction of the third movable part being shorter than a fourth length along the second direction of the fourth movable part and shorter than a fifth length along the second direction of the fifth movable part,
the second movable part including a first movable facing part facing the first conductive part in a second plane including the second direction and the third direction,
the first conductive part including a first conductive facing part facing the first movable facing part, and
the first movable facing part and the first conductive facing part extending along a first radiation direction passing through the third movable part and being along the second plane,
wherein
the first movable member includes a first beam and a second beam,
the first beam includes a first end portion and a first other end portion, the first end portion is connected to the first movable part, and the first other end portion is connected to the second movable part,
the second beam includes a second end portion and a second other end portion, the second end portion is connected to the first movable part, and the second other end portion is connected to the second movable part,
the third movable part is between the first beam and the second beam in the third direction, and
at least one of a first resonance frequency of the first beam or a second resonance frequency of the second beam is configured to change according to a displacement of the second movable part in accordance with a received acceleration.

17. A sensor, comprising:
a first detection element including
a base body,
a first support member fixed to the base body,
a conductive first movable member, and
a first conductive part fixed to the base body,
the first movable member including a first movable part, a second movable part, a third movable part, a fourth movable part and a fifth movable part,
in a second direction crossing a first direction from the base body toward the first movable member, the third movable part being between the first movable part and the second movable part, in the second direction, the fourth movable part being between the first movable part and the third movable part, in the second direction, the fifth movable part being between the third movable part and the second movable part,
the first movable part being supported by the first support member, and the second movable part, the third movable part, the fourth movable part and the fifth movable part being separated from the base body,
a first width along a third direction of the first movable part being larger than a fourth width along the third direction of the fourth movable part and larger than a fifth width along the third direction of the fifth movable part, the third direction crossing a first plane including the first direction and the second direction, a third width of the third movable part being smaller than the fourth width and smaller than the fifth width, a third length along the second direction of the third movable part being shorter than a fourth length along the second direction of the fourth movable part and shorter than a fifth length along the second direction of the fifth movable part,
the second movable part including a first movable facing part facing the first conductive part in a second plane including the second direction and the third direction, the first movable facing part including a first movable protrusion portion protruding toward the first conductive part,
the first conductive part including a first conductive facing part facing the first movable facing part, the first conductive facing part including a first conductive protrusion portion protruding toward the first movable facing part, and
the first conductive protrusion portion overlapping the first movable protrusion portion in a first radiation direction passing through the third movable part and being along the second plane, wherein
the first movable member includes a first beam and a second beam,
the first beam includes a first end portion and a first other end portion, the first end portion is connected to the first movable part, and the first other end portion is connected to the second movable part,
the second beam includes a second end portion and a second other end portion, the second end portion is connected to the first movable part, and the second other end portion is connected to the second movable part,
the third movable part is between the first beam and the second beam in the third direction, and
at least one of a first resonance frequency of the first beam or a second resonance frequency of the second beam is configured to change according to a displacement of the second movable part in accordance with a received acceleration.

18. The sensor according to claim 17, further comprising:
a controller,
the first movable member including
a first fixed conductive part facing the first beam, and
a second conductive part facing the second beam,
the controller being electrically connected to the first fixed conductive part and the second conductive part, and
the controller being configured to derive the first resonance frequency and the second resonance frequency based on a first signal obtained from the first fixed conductive part and a second signal obtained from the second fixed conductive part.

19. The sensor according to claim 18, wherein
the first movable member includes a fifth conductive part facing the first beam and a sixth conductive part facing the second beam,
the controller is electrically connected to the fifth conductive part and the sixth conductive part,
the controller is configured to control a potential difference between the first movable part and the first conductive part so as to reduce a change amount of a difference between the first resonance frequency and the second resonance frequency.

20. The sensor according to claim 17, further comprising:
a second detection element including
a second support member, and
a second movable member supported by the second support member and separated from the base body,
an angle being configured to be detected from a signal corresponding to a movement of the second movable member.

* * * * *